(12) United States Patent
Brussaard et al.

(10) Patent No.: US 10,670,974 B2
(45) Date of Patent: Jun. 2, 2020

(54) METROLOGY APPARATUS FOR AND A METHOD OF DETERMINING A CHARACTERISTIC OF INTEREST OF A STRUCTURE ON A SUBSTRATE

(71) Applicant: ASML Netherlands B.V., Veldhoven (NL)

(72) Inventors: Gerrit Jacobus Hendrik Brussaard, Boxtel (NL); Petrus Wilhelmus Smorenburg, Veldhoven (NL); Teis Johan Coenen, Vught (NL); Niels Geypen, Lommel (BE); Peter Danny Van Voorst, Nijmegen (NL); Sander Bas Roobol, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/233,707

(22) Filed: Dec. 27, 2018

(65) Prior Publication Data

US 2019/0204757 A1   Jul. 4, 2019

(30) Foreign Application Priority Data

Dec. 28, 2017   (EP) .................................... 17210833
Feb. 15, 2018   (EP) .................................... 18156870

(51) Int. Cl.
*G03F 7/20* (2006.01)

(52) U.S. Cl.
CPC ...... *G03F 7/70625* (2013.01); *G03F 7/70033* (2013.01); *G03F 7/70158* (2013.01); *G03F 7/70616* (2013.01); *G03F 7/70633* (2013.01)

(58) Field of Classification Search
CPC ............. G03F 7/70625; G03F 7/70633; G03F 7/70033; G03F 9/7065; G03F 9/7046
(Continued)

(56) References Cited

U.S. PATENT DOCUMENTS 6,952,253 B2   10/2005   Lof et al.
7,701,577 B2    4/2010   Straaijer et al.
(Continued)

FOREIGN PATENT DOCUMENTS

CN   105549341 A   5/2016
EP   1 628 164 A2   2/2006
(Continued)

OTHER PUBLICATIONS

International Search Report directed to related International Patent Application No. PCT/EP2018/083507, dated Feb. 28, 2019; 5 pages.
(Continued)

*Primary Examiner* — Hung Nguyen
(74) *Attorney, Agent, or Firm* — Sterne, Kessler, Goldstein & Fox P.L.L.C.

(57) ABSTRACT

A metrology apparatus for determining a characteristic of interest of a structure on a substrate, the structure having diffractive properties, the apparatus comprising: focusing optics configured to focus illumination radiation comprising a plurality of wavelengths onto the structure; a first detector configured to detect at least part of the illumination radiation which has been diffracted from the structure; and additional optics configured to produce, on at least a portion of the first detector, a wavelength-dependent spatial distribution of different wavelengths of the illumination radiation which has been diffracted from the structure, wherein the first detector is arranged to detect at least a non-zero diffraction order of the illumination radiation which has been diffracted from the structure.

16 Claims, 19 Drawing Sheets

(58) Field of Classification Search
USPC .................................. 355/52, 53, 67–71
See application file for complete search history.

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 * | 8/2014 | Straaijer ............... G01B 11/24 356/625 |
| 8,823,922 | B2 | 9/2014 | Den Boef |
| 10,274,370 | B2 | 4/2019 | Den Boef |
| 2003/0071996 | A1 * | 4/2003 | Wang .................... G01B 11/00 356/369 |
| 2007/0224518 | A1 | 9/2007 | Yokhin et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2013/0304424 | A1 | 11/2013 | Bakeman et al. |
| 2014/0019097 | A1 | 1/2014 | Bakeman et al. |
| 2015/0146841 | A1 * | 5/2015 | Lin ....................... H01L 22/12 378/1 |
| 2015/0176979 | A1 | 6/2015 | Mathijssen et al. |
| 2016/0161863 | A1 | 6/2016 | Den Boef et al. |
| 2016/0282282 | A1 | 9/2016 | Quintanilha et al. |
| 2016/0370717 | A1 | 12/2016 | Den Boef et al. |
| 2017/0082932 | A1 * | 3/2017 | Fu ......................... G03F 9/7065 |
| 2017/0184981 | A1 | 6/2017 | Quintanilha et al. |
| 2017/0205342 | A1 | 7/2017 | Krishnan et al. |

FOREIGN PATENT DOCUMENTS

| | | |
|---|---|---|
| EP | 3 410 211 A1 | 12/2018 |
| WO | WO 2011/012624 A1 | 2/2011 |
| WO | WO 2018/202414 A1 | 11/2018 |
| WO | WO 2018/219585 A1 | 12/2018 |

OTHER PUBLICATIONS

Freisem et al., "Spectrally resolved single-shot wavefront sensing of broadband high-harmonic sources," Advanced Research Center for Nanolithography, Dec. 12, 2017; pp. 1-12.

Lemaillet et al., "Intercomparison between optical and x-ray scatterometry measurements of FinFET structures," Proceedings SPIE Advanced Lithography, Metrology, Inspection, and Process Control for Microlithography XXVII, vol. 8681, 2013; 8 pages.

International Search Report and Written Opinion of the International Searching Authority directed to related International Patent Application No. PCT/EP2018/083507, dated Feb. 28, 2019; 10 pages.

* cited by examiner

METROLOGY APPARATUS FOR AND A METHOD OF DETERMINING A CHARACTERISTIC OF INTEREST OF A STRUCTURE ON A SUBSTRATE

FIELD

The present disclosure relates to methods and apparatus for inspection (e.g., metrology) usable, for example, in the manufacture of devices by lithographic techniques and to methods of manufacturing devices using lithographic techniques

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate, in general, a single substrate will contain a network of adjacent target portions that are successively patterned. These target portions are commonly referred to as "fields".

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In lithographic processes, it is desirable to frequently make measurements of the structures created, e.g. for process control and verification. Tools to make such measurement are typically called metrology tools MT. Different types of metrology tools MT for making such measurements are known, including scanning electron microscopes or various forms of scatterometer metrology tools MT.

A problem addressed by the current invention is how to improve the sensitivity and/or accuracy of a measurement, such as an overlay measurement, when performing scatterometry measurements with EUV radiation.

SUMMARY OF THE INVENTION

According to a first aspect of the present invention there is provided a metrology apparatus for determining a characteristic of interest of a structure on a substrate, the structure having diffractive properties, the apparatus comprising: focusing optics configured to focus illumination radiation comprising a plurality of wavelengths onto the structure; a first detector configured to detect at least part of the illumination radiation which has been diffracted from the structure; and additional optics configured to produce, on at least a portion of the first detector, a wavelength-dependent spatial distribution of different wavelengths of the illumination radiation which has been diffracted from the structure, wherein the first detector is arranged to detect at least a non-zero diffraction order of the illumination radiation which has been diffracted from the structure.

The first detector may be arranged to detect at least one of the +1st or −1st diffraction order of the illumination radiation which has been diffracted from the structure.

The metrology apparatus may further comprise a second detector configured to detect at least part of the illumination radiation which has been diffracted from the structure, the additional optics being further configured to produce, on at least a portion of the second detector, a wavelength-dependent spatial distribution of different wavelengths of the illumination radiation which has been diffracted from the structure, wherein the first and second detectors are arranged to detect different diffraction orders.

The first and second detectors may be arranged to detect the +1st and −1st diffraction orders respectively.

The illumination radiation may comprise radiation in the extreme ultraviolet range. The optical metrology apparatus may further comprise a radiation source configured to emit the illumination radiation. The radiation source may be a high-harmonic generation, HHG, source.

The additional optics may comprise separation optics configured to spatially separate, on at least a portion of the first and/or second detector, different wavelengths of the illumination radiation which has been diffracted from the structure.

The separation optics may be further configured to spatially combine, on at least a different portion of the first and/or second detectors different wavelengths of the illumination radiation which has been diffracted from the structure. By different portion it is meant at a different position on the detector to where the spatially separated wavelength components are directed by the separation optics.

The separation optics may comprise a combination of a diffracting element and a focusing element. The focusing element may be a grazing incidence mirror, such as a cylindrical or toroidal mirror. The diffracting element may be a transmission grating. The focusing element may be placed after the transmission grating with respect to the direction of propagation of the radiation. The diffracting element may be a reflection grating. A reflection grating may be more suitable in the soft X-ray/EUV regime. The reflection grating may be placed after the focusing element with respect to the propagation direction of the radiation. The diffracting element and the focusing element may be combined as a single reflective imaging grating. The imaging grating may comprise lines with a linear spacing. The line density may be in the range from 100 lines/mm to 50 000 lines/mm. The imaging grating may comprise lines with a variable spacing, such that the imaging grating is configured focus different wavelengths of the radiation diffracted from the structure along a substantially straight line at the surface of the first or second detector.

Alternatively, the additional optics may comprise a mask layer which is configured to spatially separate, on at least a portion of the first and/or second detector, different wavelengths of the illumination radiation which has been diffracted from the structure. The mask layer may comprise a substantially opaque material containing one or more apertures. Each aperture may comprise a transmission grating. The mask may contain only one aperture. The apertures may be rectangular. The mask may be a Hartmann-type mask.

Alternatively, the additional optics may comprise a scattering element. The scattering element may be arranged to produce a speckle pattern in the illumination radiation which has been diffracted from the structure, wherein the first detector is arranged to detect at least a portion of the speckle pattern. The scattering element may comprise a quasi-random or non-periodic pattern. The quasi-random or non-periodic pattern may be applied either to a grazing incidence mirror or to a transmission film. The quasi-random or non-periodic pattern may be known by a prior characterization of the scattering element. The scattering element may be arranged to be translated or rotated during detection of the illumination radiation.

The first and second detectors may be distinct regions of a single array detector or a single line detector.

The metrology apparatus may further comprise a processor configured to determine a value for the characteristic of interest based on a readout from at least the first detector. The characteristic of interest may be at least one of: an overlay value (OV) of two layers within the structure, or a critical dimension (CD) value of an element within the structure.

The metrology apparatus may be configured to perform a calibration using the detected zeroth order of the illumination radiation diffracted from the structure.

A numerical aperture, NA, of the illumination radiation focused onto the structure may be in the range 0.01 to 0.05.

According to a second aspect of the present invention there is provided a method for determining a characteristic of interest of a structure on a substrate using an optical metrology apparatus, the structure having diffractive properties, the method comprising: focusing onto the structure illumination radiation comprising a plurality of wavelengths using focusing optics; detecting at least part of the illumination radiation which has been diffracted from the structure using a first detector; and producing on at least a portion of the first detector, by additional optics, a wavelength-dependent spatial distribution of different wavelengths of the illumination radiation which has been diffracted from the structure, wherein the first detector detects at least a non-zero diffraction order of the illumination radiation which has been diffracted from the structure.

The first detector may detect at least one of the +1st or −1st diffraction order of the illumination radiation which has been diffracted from the structure.

The method may further comprise: detecting at least part of the illumination radiation which has been diffracted from the structure using a second detector; and producing on at least a portion of the second detector, by the additional optics, a wavelength-dependent spatial distribution of different wavelengths of the illumination radiation which has been diffracted from the structure, wherein the first and second detectors detect different diffraction orders.

The first and second detectors may detect the +1st and −1st diffraction orders respectively.

The additional optics may spatially separate, on at least a portion of the first and/or second detector, different wavelengths of the illumination radiation which has been diffracted from the structure.

The additional optics may also spatially combine, on at least a different portion of the first and/or second detectors different wavelengths of the illumination radiation which has been diffracted from the structure.

The method may further comprise operating a radiation source to provide said illumination radiation comprising radiation in the extreme ultraviolet range.

The method may further comprise determining a value for the characteristic of interest based on a readout from at least the first detector. The characteristic of interest may be at least one of: the overlay (OV) of two layers within the structure, or the critical dimension (CD) of an element within the structure.

A scattering element may be used to produce the wavelength-dependent spatial distribution of the illumination radiation which has been diffracted from the structure. The scattering element may produce a speckle pattern in the illumination radiation which has been diffracted from the structure, wherein the first detector detects at least a portion of the speckle pattern. The method may further comprise characterizing the scattering element. The method may further comprise translating or rotating the scattering element during detection of the illumination radiation which has been diffracted from the structure. The detected illumination radiation may be analyzed by compressed sensing.

According to a third aspect of the present invention, a computer program is provided comprising instructions which when executed on at least one processor cause the processor to control an apparatus to carry out a method according to the second aspect of the invention.

According to a fourth aspect of the present invention, a carrier is provided containing the computer program according to the third aspect, wherein the carrier is one of an electronic signal, optical signal, radio signal, or non-transitory computer readable storage medium.

According to a fifth aspect of the present invention, a lithographic apparatus is provided comprising the optical metrology apparatus according to the first aspect.

According to a sixth aspect of the present invention, a lithographic cell is provided comprising the apparatus according to the fifth aspect.

The structure on the substrate may only have diffractive properties within a certain wavelength range of electromagnetic radiation and accordingly the plurality of wavelengths of the illumination radiation should fall at least partially, and preferably completely, within the wavelength range of electromagnetic radiation over which the structure on the substrate has diffractive properties.

The substrate may be a semiconductor wafer. The structure on the substrate having diffractive properties may be a metrology target having an ensemble of composite gratings, formed by a lithographic process. The structure having diffractive properties may also be a product structure fabricated on the semiconductor wafer.

The illumination radiation may comprise soft X-rays or EUV radiation, for example radiation in a wavelength range between 0.1 nm and 100 nm, or optionally between 1 nm and 50 nm or optionally between 10 nm and 20 nm.

The present invention aims to enable detection of the non-zero diffraction orders of the illumination radiation with a greater spectral resolution. This provides a corresponding improvement in the sensitivity of a measurement such as an overlay measurement or critical dimension measurement used in the characterization of a structure on a substrate such as a structure on a semiconductor wafer. This enables a reduced acquisition time and/or provides for a higher accuracy. Further, the invention aims to enable characteristics of interest to be determined for smaller, at resolution features on the substrate which enables metrology with smaller targets and consequently more efficient use of the available space on a semiconductor wafer.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Figure 1:
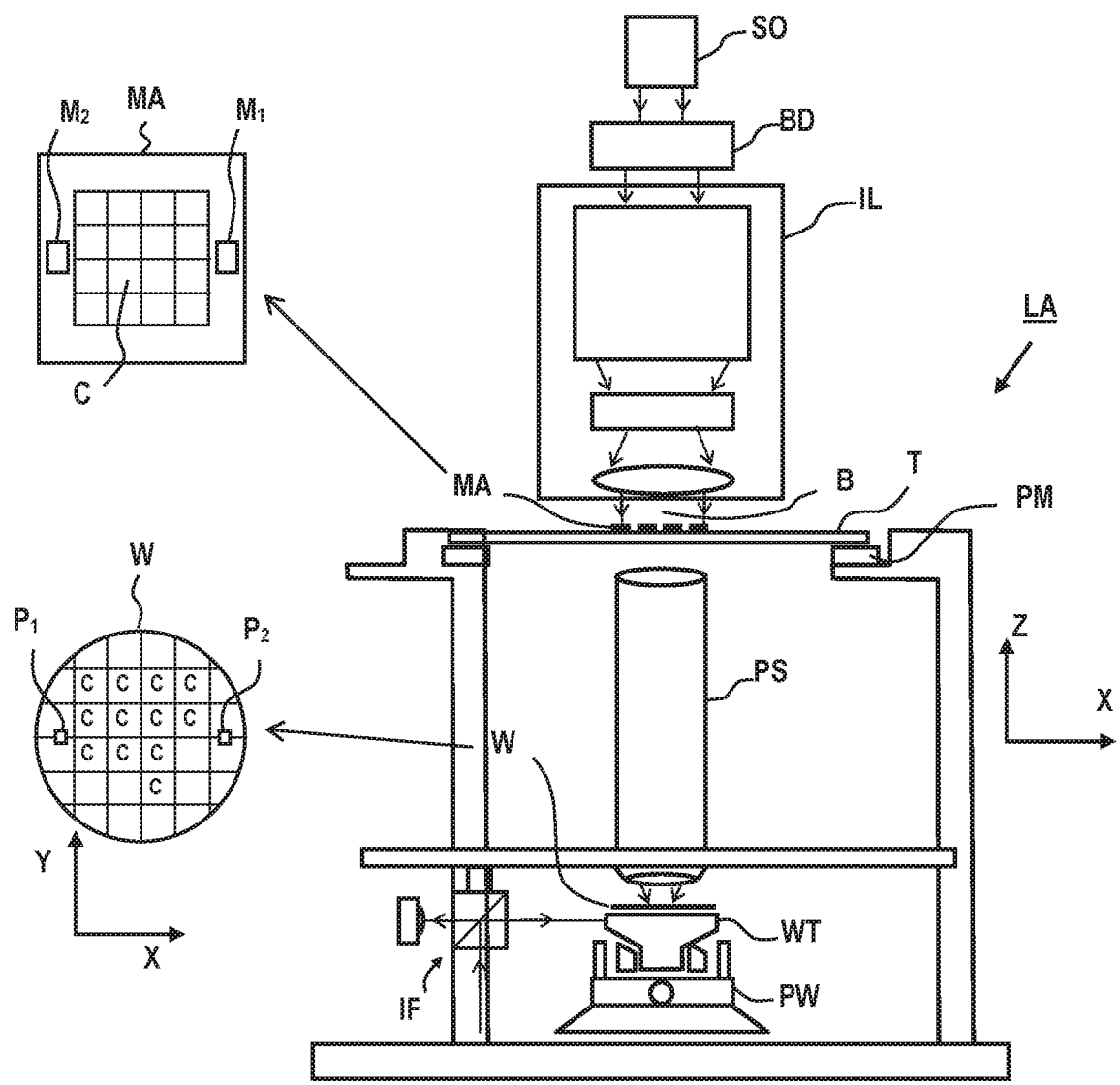
FIG. 1 depicts a schematic overview of a lithographic apparatus.

In lithographic processes, it is desirable to frequently make measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light/radiation from soft X-ray and visible to near-IR wavelength range.

A first type of scatterometer is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

A second type of scatterometer is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation (i.e. the 0th order). From this data, the structure or profile of the target giving rise to the detected spectrum may be reconstructed, e.g. by Rigorous Coupled Wave Analysis and non-linear regression or by comparison with a library of simulated spectra.

A third type of scatterometer is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033, 135, 13/533,110 and 13/891,410 incorporated herein by reference in their entirety.

The scatterometer MT may be adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in patent application EP1,628,164A, such that any asymmetry is clearly distinguishable. This provides a straightforward way to measure misalignment in gratings. Further examples for measuring overlay error between the two layers containing periodic structures as target through asymmetry of the periodic structures may be found in PCT patent application publication no. WO 2011/012624 or US patent application US 20160161863, incorporated herein by reference in its entirety.

Other parameters of interest may be focus and dose and more in particular the focus and dose being used by the lithographic apparatus while printing a pattern on a substrate. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch processing for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and not yet published U.S. patent application Ser. No. 15/181,126, incorporated herein by reference in its entirety.

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of a metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence can be used for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using X-rays and optical measurements with wavelengths in the range 120 nm and 2000 nm are combined together to obtain a measurement of a parameter such as CD. A CD measurement is Obtained by coupling an x-ray mathematical model and an optical mathematical model together. The content of the cited US patent applications are incorporated herein by reference in their entirety.

Before describing embodiments of the invention in detail, it is instructive to present an example environment in which embodiments of the present invention may be implemented.

In the present document, the terms "radiation" and "beam" are used to encompass all types of electromagnetic radiation, including ultraviolet radiation (e.g. with a wavelength of 365, 248, 193, 157 or 126 nm), EUV (extreme ultra-violet radiation, e.g. having a wavelength in the range of about 1-100 nm) and/or soft X-ray radiation (e.g. radiation in a wavelength range from 0.1 to 10 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
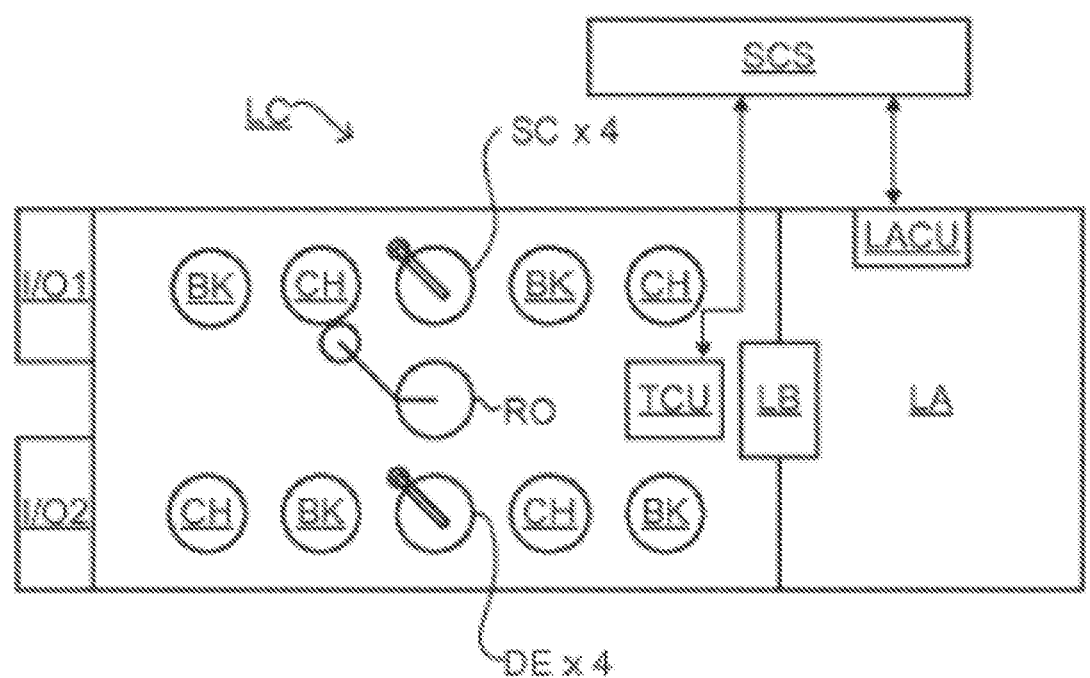
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
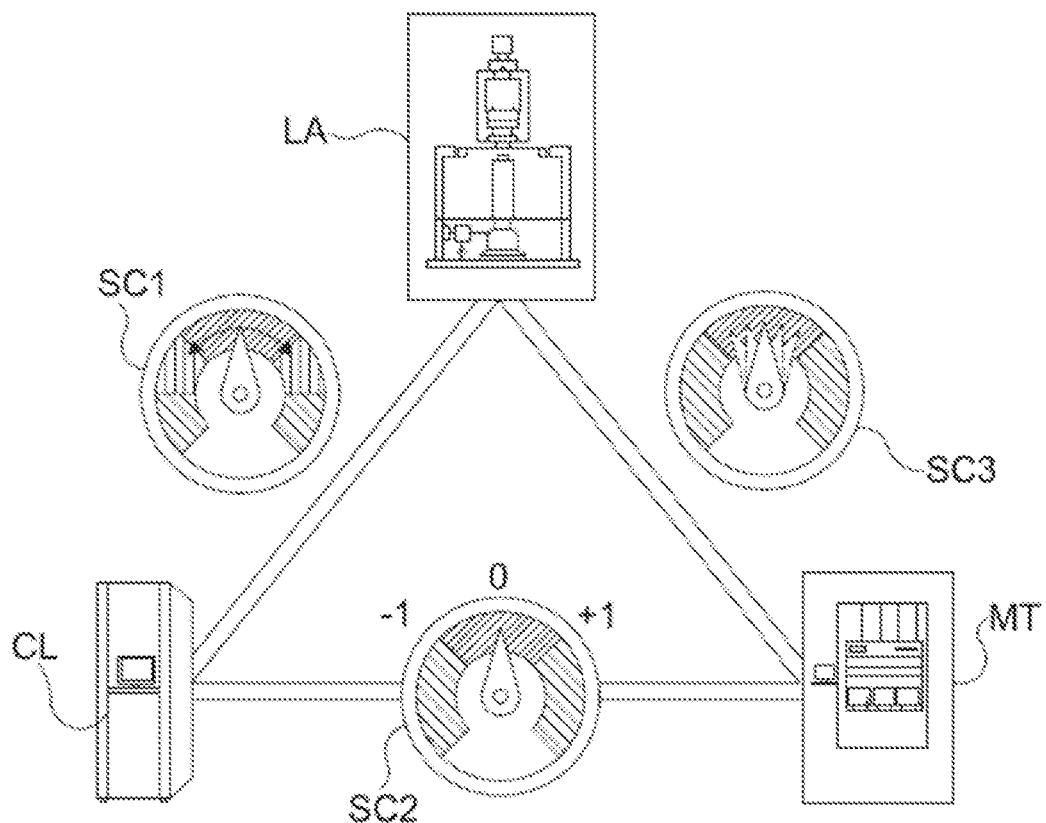
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Figure 4:
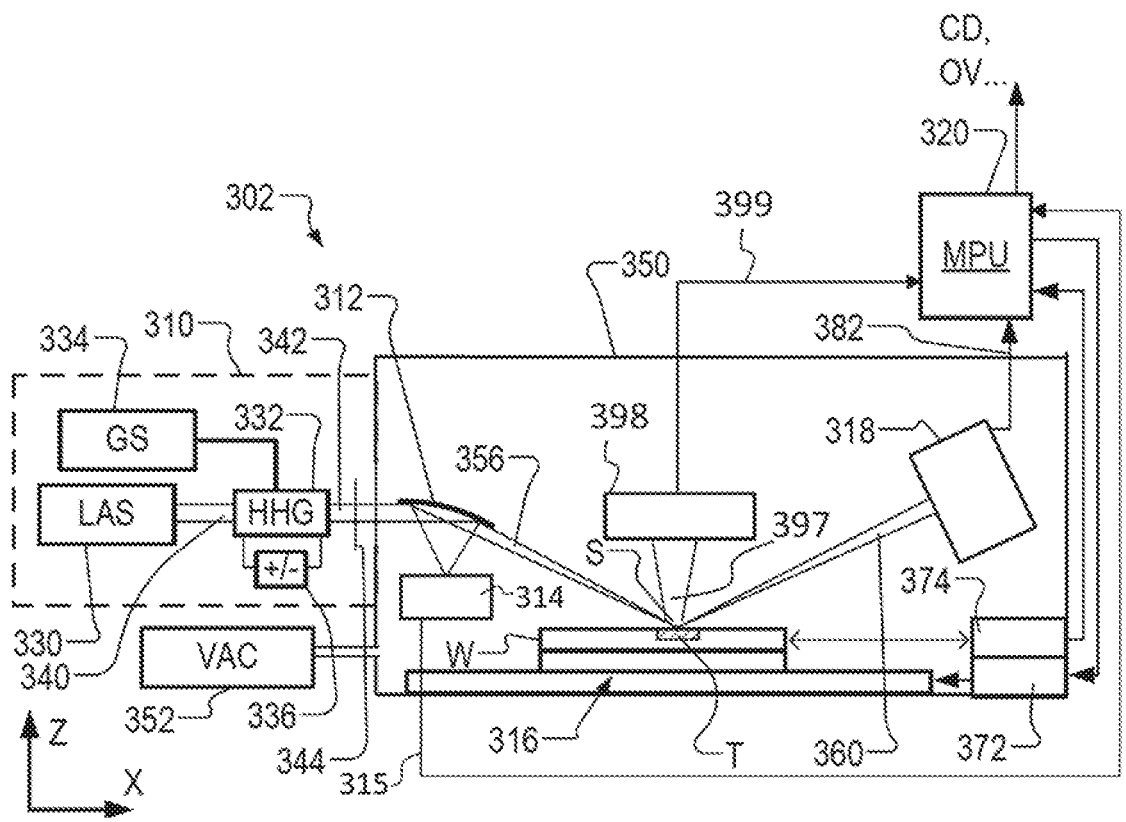
FIG. 4 depicts a schematic representation of a metrology apparatus in which radiation in the wavelength range from 0.1 nm to 100 nm may be used to measure parameters/characteristics of structures on a substrate.

FIG. 4 depicts a schematic representation of a metrology apparatus 302 in which radiation in the wavelength range from 0.1 nm to 100 nm may be used to measure parameters/characteristics of structures on a substrate. The metrology apparatus 302 presented in FIG. 4 is suitable for the soft X-rays or EUV domain.

FIG. 4 illustrates a schematic physical arrangement of a metrology apparatus 302 comprising a spectroscopic scatterometer using EUV and/or soft X-ray radiation in grazing incidence, purely by way of example. An alternative form of inspection apparatus might be provided in the form of an angle-resolved scatterormeter, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft X-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 µm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). N2, O2, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that soft X-ray radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm have a low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 µm diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the strictureof interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 4, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 4 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted radiation 397 and/or may include images obtained from the diffracted radiation 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), and overlay or critical dimension of features measured on product structures. The soft X-ray and/or EUV radiation may for example have wavelengths less than 100 nm and more than 0.1 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

The inventors have appreciated that in practice, the illumination system 312 should focus the incoming illumination radiation to a small spot on the structure of interest. For example, a spot having a diameter in the region of 5-10 µm, or even smaller, e.g. in the region of 1 µm. This is partly to avoid any stray radiation damaging the structures surrounding the structure of interest and partly to avoid any unwanted signal reaching the detectors, e.g. reflected light from regions surrounding the structure of interest on the substrate. The resulting numerical aperture (NA) of the radiation may therefore typically be in the region of 0.01 to 0.05 for illumination radiation in the EUV wavelength range. The numerical aperture may be in the range 0.001 to 0.1. The numerical may be in the range 0.02 to 0.04. The incoming illumination radiation may be understood as resembling a cone with its tip at or near the structure of interest. Similarly, the illumination radiation which is diffracted and reflected from the structure of interest will also form cones with an NA equivalent to that of the illumination radiation (if the spot size is smaller than the structure of interest).

The inventors have appreciated that the resultant relatively large NA of the diffracted/reflected illumination radiation will cause a reduction in the sensitivity of the scatterometer, as will now be explained now with reference to FIGS. 5 to 10.

Figure 5:
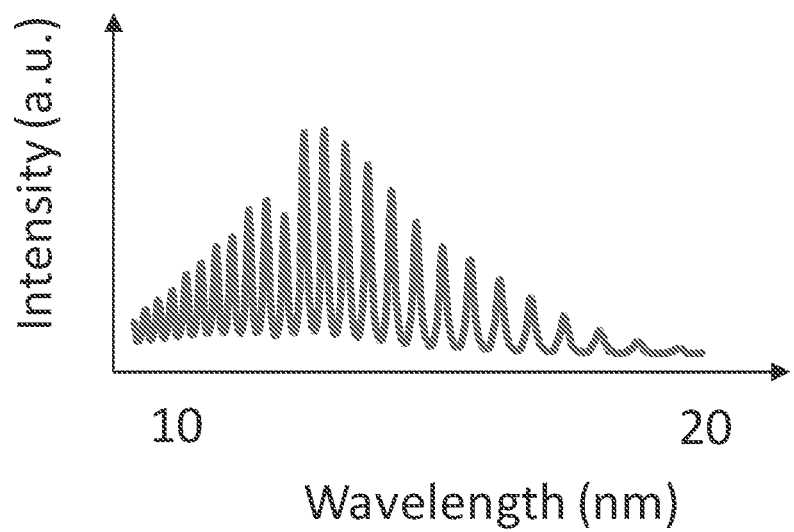
FIG. 5 illustrates a typical spectrum obtained from an EUV source such as a high-harmonic generation source.

FIG. 5 illustrates an example of a spectrum obtained from an EUV source such as a high-harmonic generation source, as described above. The EUV radiation serves as the illumination radiation for the structure of interest. The spectrum comprises a plurality of discrete wavelength components in an interval of approximately 10 nm to 20 nm.

Figure 6:
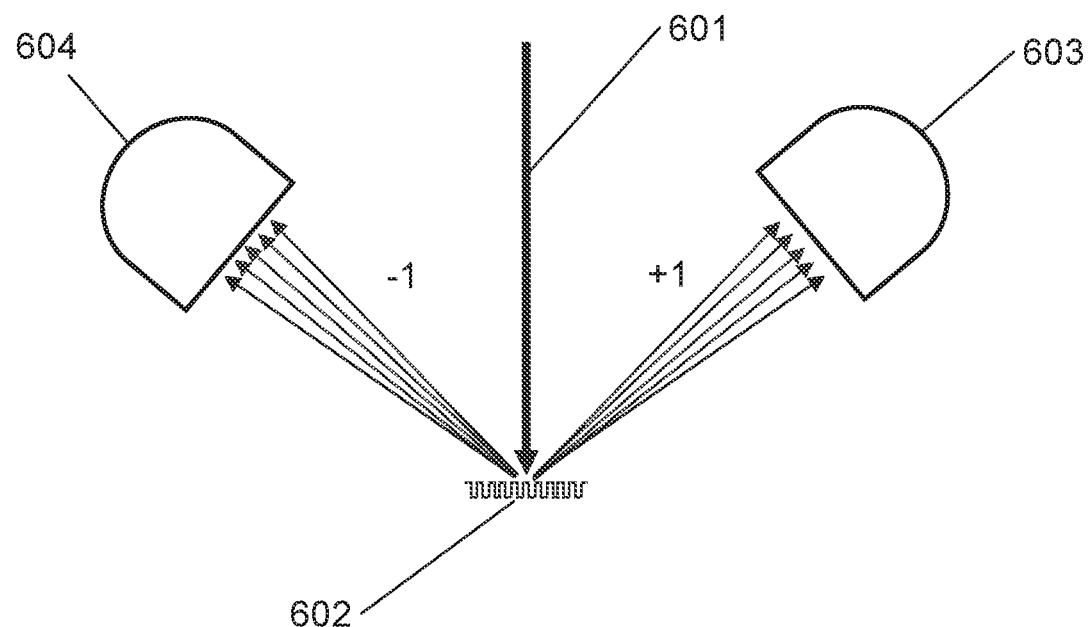
FIG. 6 illustrates an example of illumination radiation having a plurality of wavelengths being incident on a diffraction grating.

In FIG. 6, the illumination radiation 601 is incident on a diffraction grating 602. First and second detectors 603 and 604 are arranged so as to detect the +1st and −1st diffraction orders respectively of the illumination radiation which is diffracted from the target. The angle at which the illumination radiation is diffracted depends on the grating pitch and the wavelength of the illumination radiation. Accordingly, when using an HHG source to generate the EUV illumination radiation, the different harmonics, or wavelengths, will diffract at different angles and can in principle be separately resolved by the detectors 603 and 604.

Figure 7:
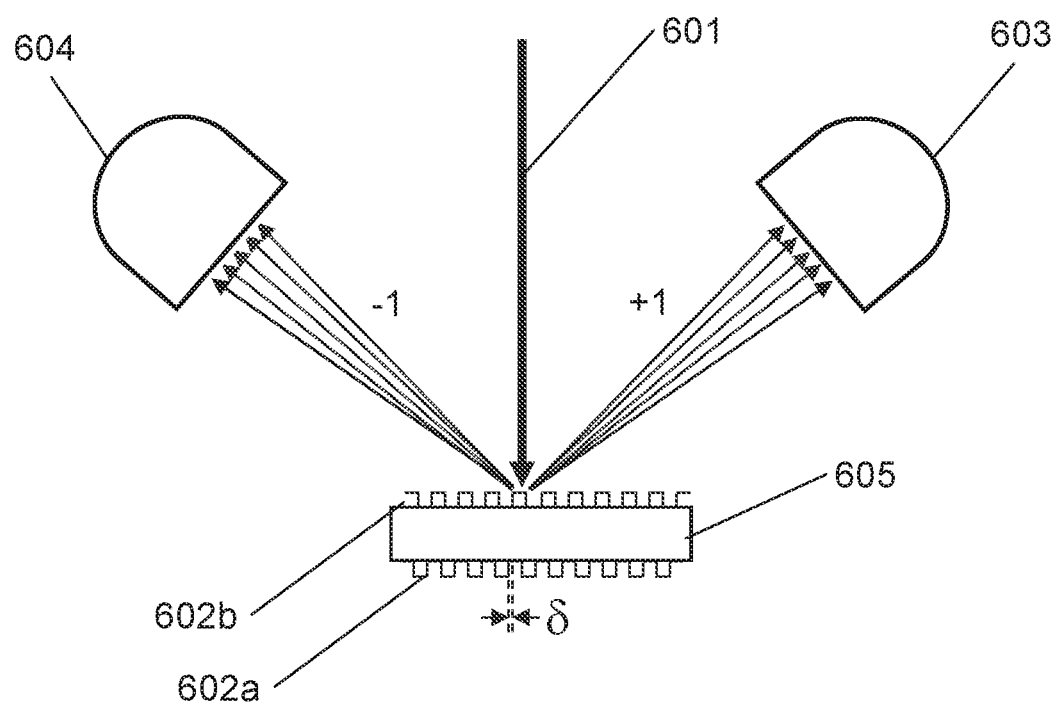
FIG. 7 illustrates a situation similar to that of FIG. 6 but in the context of performing diffraction-based measurements of asymmetry in a scatterometer.

FIG. 7 shows a situation similar to that of FIG. 6 but in the context of performing diffraction-based measurements of asymmetry in a scatterometer. An important measure in the production of semiconductor structures is the overlay between different layers in a stack. When two diffraction gratings 602a and 602b, separated by a stack of other layers 605, have an offset δ with respect to each other, there can occur a difference between the intensity of radiation diffracted in the +1st order and −1st order. This difference can be measured (and calibrated) by detectors 603 and 604 to determine the overlay δ.

Figure 8:
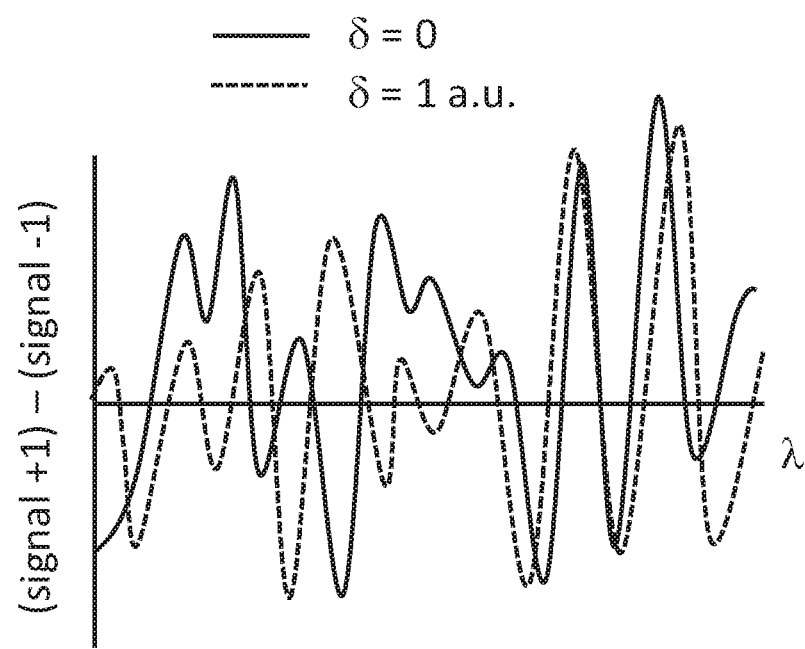
FIG. 8 illustrates an example of the difference between the intensity detected by two detectors of a scatterometer as a function of wavelength λ for two different values of the overlay δ.

The difference in the signals on the two detectors 603 and 604 strongly depends on the wavelength of the illumination radiation, due to interference of the radiation in the layers of the stack 605 between the gratings and the composition of the intermediate layers of the stack. FIG. 8 illustrates an example of the difference between the intensity detected by detector 603 and the intensity detected by detector 604 as a function of wavelength for two different values of the overlay δ (0 a.u. and 1 a.u.). Herein the term "the curve" is used to refer to a relation between wavelength (x-axis) and the difference between two signals (y-axis). Ideally, one would want to measure at the wavelength that has the greatest sensitivity which is represented by the wavelength having the largest difference between the solid and the dashed line in FIG. 8. Alternatively, one would want to be able to resolve the whole curve. Therefore, an important condition is that the different wavelengths can be resolved well enough to resolve the oscillations in the curve.

Figure 9:
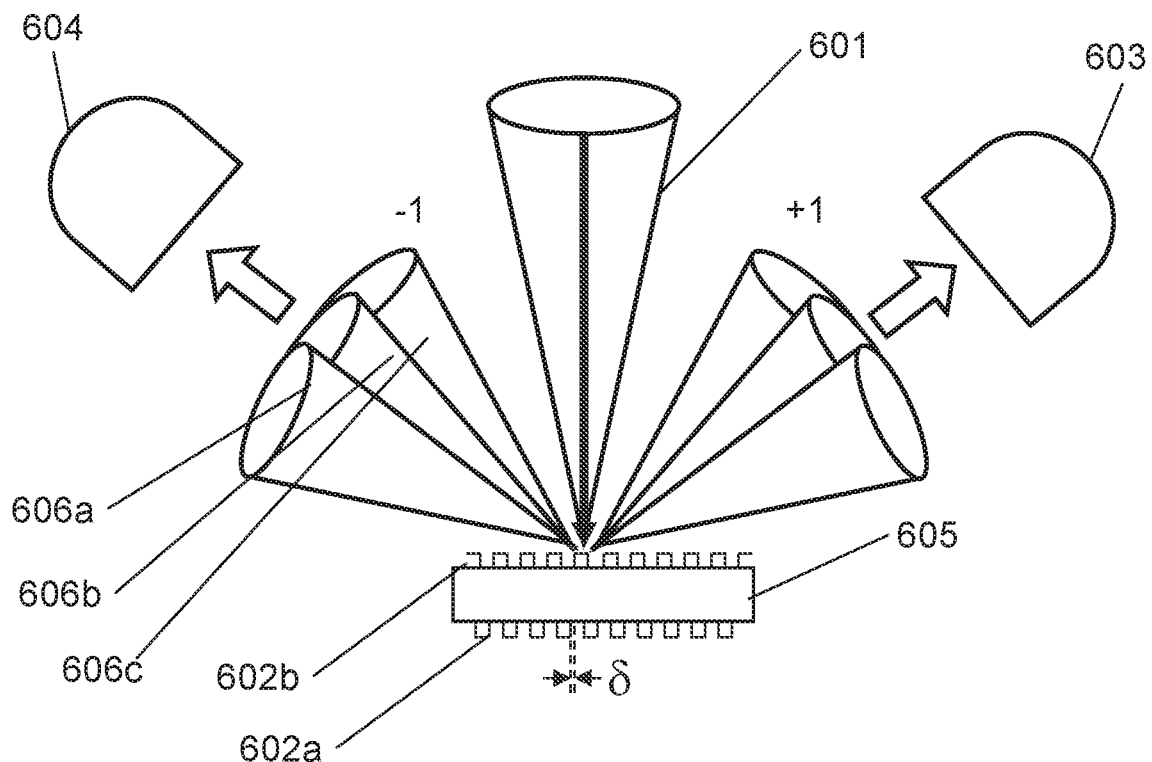
FIG. 9 illustrates a situation similar to that of FIG. 7 but when the illumination radiation is tightly focused.
Figure 10:
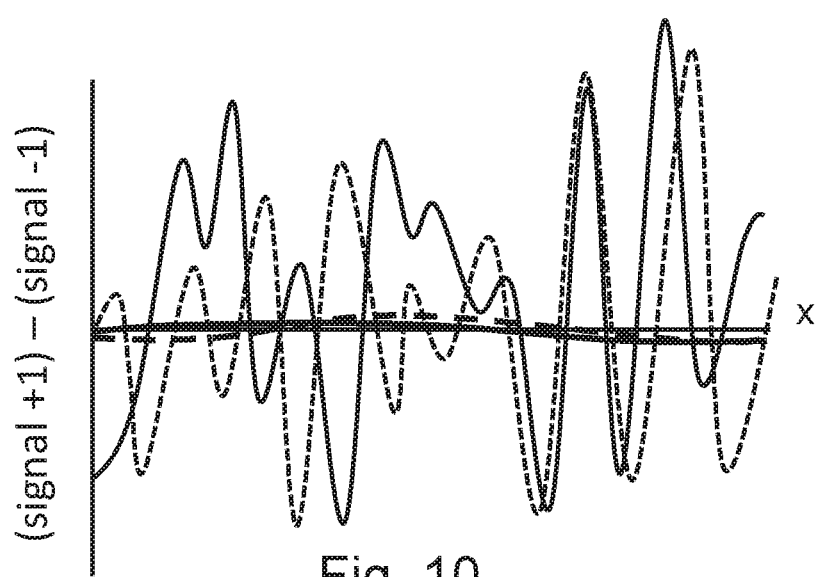
FIG. 10 illustrates an example of the difference between the intensity detected by two detectors of a scatterometer as a function of wavelength λ for two different values of the overlay δ, for the case where the illumination radiation is tightly focused.

However, the example of FIGS. 7 and 8 does not illustrate the effect of tightly focusing the illumination radiation on the structure of interest. As mentioned above, the incoming illumination radiation 601 may be understood as resembling a cone with its tip at or near the structure of interest. Similarly, the illumination radiation which is diffracted and reflected from the structure of interest will also form cones with an NA equivalent to that of the illumination radiation (if the spot size is smaller than the structure of interest). In FIG. 9, for simplicity three discrete diffracted wavelengths of the illumination radiation are schematically represented in each of the +1st and −1st diffraction orders. Each diffracted wavelength component consists of a separate cone 606a, 606b and 606c propagating towards the detectors 603 and 604. The effect of the finite (not infinitely small) NA of the illumination radiation is that the diffracted radiation of different wavelengths will overlap on the detectors 603 and 604. In other words, a specific pixel of the detector will receive radiation of different wavelengths. This reduces the wavelength resolution of the system. FIG. 10 illustrates the impact the reduced wavelength resolution has on the resolution of the curve. Because different wavelengths reach the same detector pixel the curves are effectively smoothened. The sensitivity of a measurement, e.g. of overlay, is much reduced. This is because the intensity difference is much reduced as a result of the smoothing.

Figure 11:
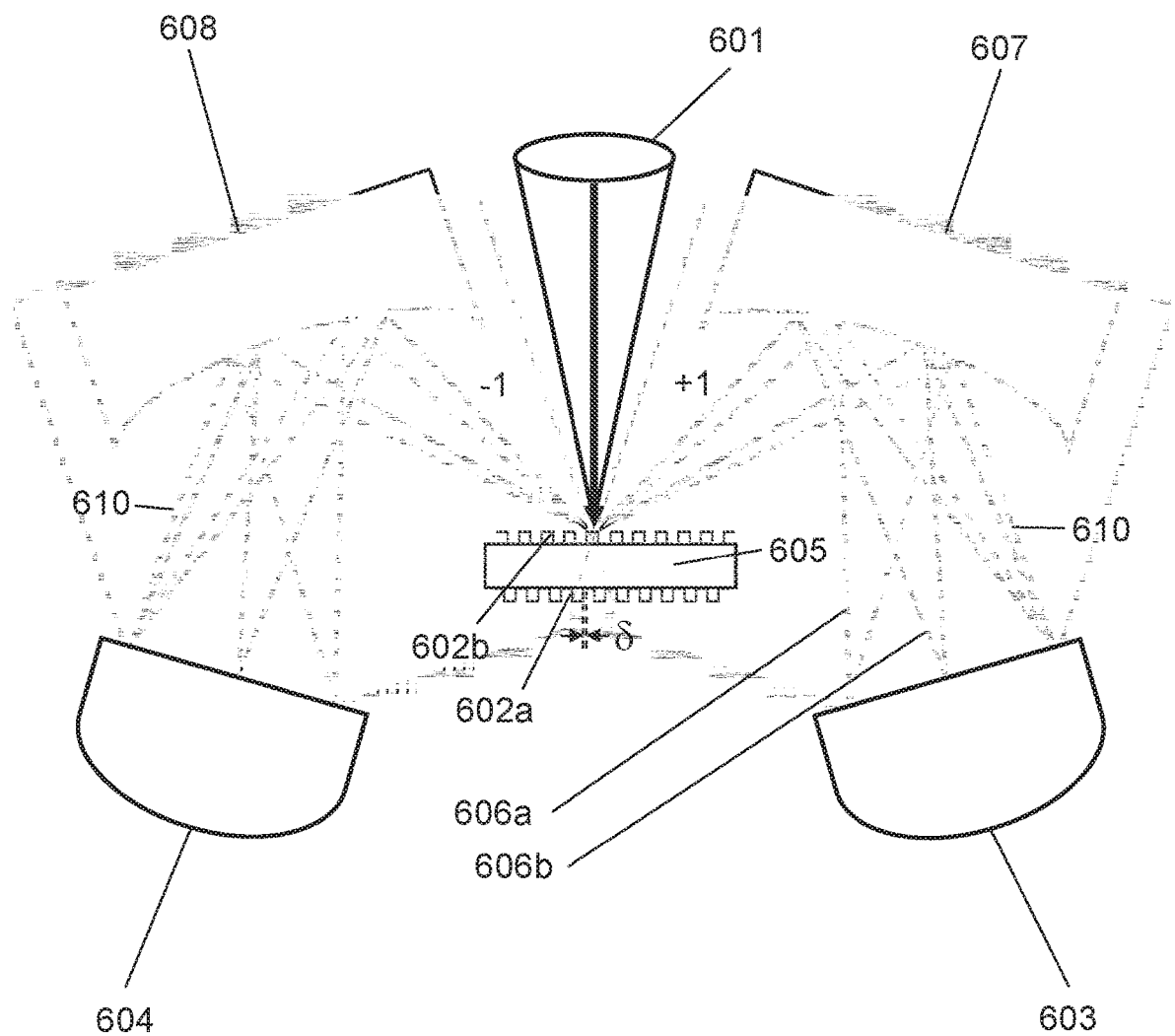
FIG. 11 illustrates a first embodiment of the invention using an imaging grating.

To overcome the smoothing of the curve explained above, and therefore to avoid the resulting loss in sensitivity of the measurement technique, according to a first embodiment of the invention, additional optics in the form of separation optics are provided comprising a combination of a diffracting element and a focusing element. As illustrated in FIG. 11, in the first embodiment the diffracting element and focusing element consist of a single imaging grating 607, 608 placed before each detector, whereby one such imaging grating is placed in each of the +1st and −1st diffraction orders of the illumination radiation 601 which has been diffracted from the structure on the substrate, i.e. from the gratings 602a and 602b which are formed within the structure. One of each of the imaging gratings is placed between the substrate and the first and second detectors 603 and 604 in the path of the +1st and −1st diffraction orders respectively. For simplicity, in FIG. 11 the illumination radiation is only shown with two discrete wavelengths 606a and 606b, although in practice the illumination radiation may comprise a large number of different wavelengths, e.g. if the illumination radiation source is a high-harmonic generation source as described above with reference to FIG. 5.

In the first embodiment, the imaging grating is a grazing incidence mirror which is curved at least in one direction in order to re-focus the radiation diffracted from the structure. For example, it may be a toroidal or cylindrical mirror. On the mirror surface, a diffraction grating is formed to diffract the incident radiation, whereby different wavelengths incident on the imaging grating will be diffracted at a different angle. Combined with the re-focusing effect of the cylindrical/toroidal mirror, the imaging grating can be arranged in such a manner as to focus the different wavelengths at different locations on the detector surfaces, for example different detector pixels. This has the effect of improving the spectral resolution of the detection and hence improving the sensitivity of the measurement setup thereby enabling the curve to be fully resolved, with the advantages set out above. The detectors are arranged to detect the +1st and −1st order diffraction from the imaging gratings.

In one example the diffraction grating is a linear grating, i.e. the line density/spacing is constant across the surface of the grating. In this case, the positions of the foci of the 1st diffraction orders of the different wavelengths are arranged approximately along an arc. In another example, the diffraction grating is formed with a variable line spacing. In this case, the positions of the foci of the 1st diffraction orders of the different wavelengths are arranged approximately along a straight line.

Figure 12:
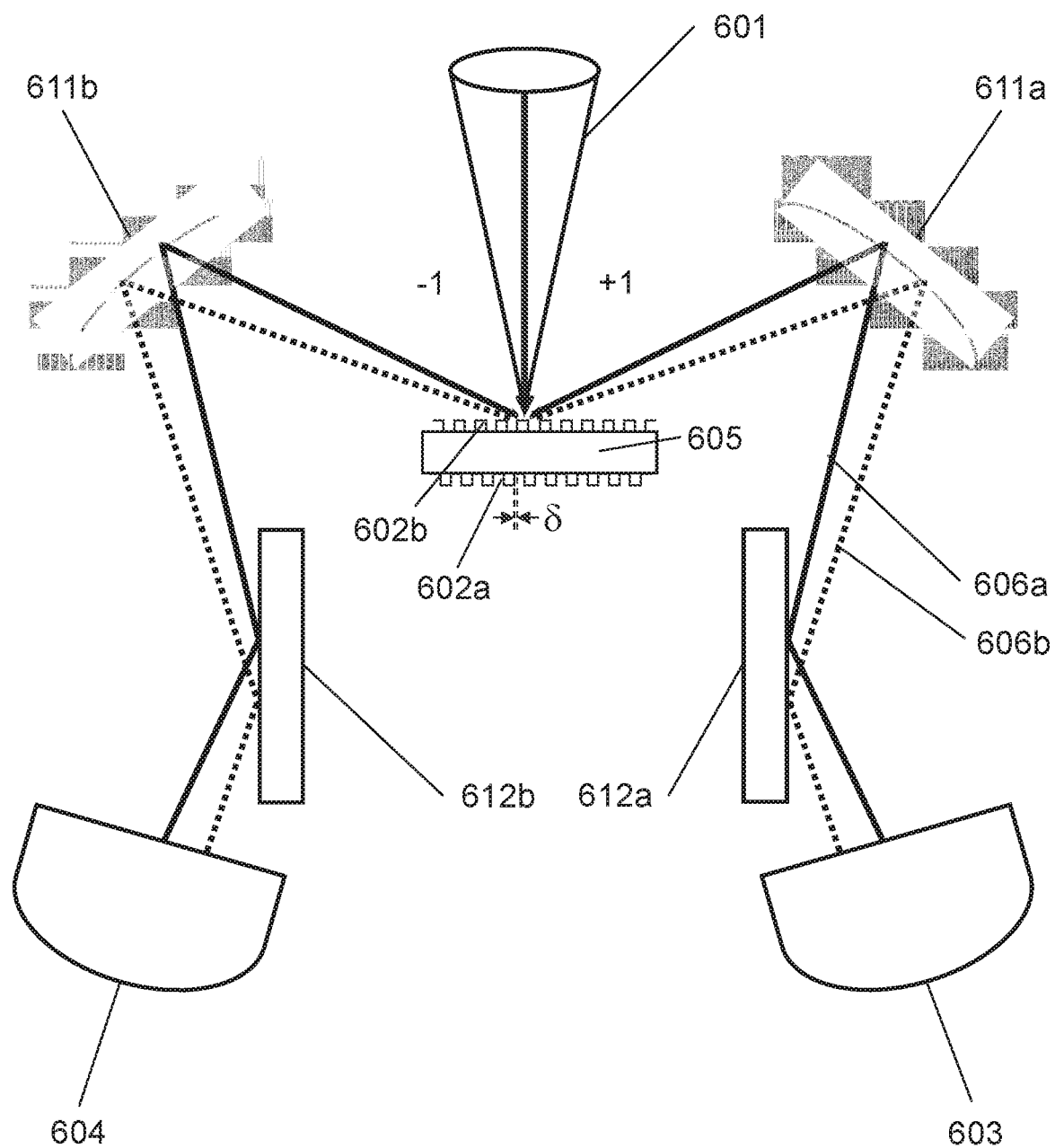
FIG. 12 illustrates a second embodiment of the invention using a combination of a focusing mirror and a reflection diffraction grating.

In a second embodiment, rather than using a single imaging grating 607, 608 to re-image each diffraction order from the structure on the substrate, a separate diffracting element and focusing element is provided for each detector. FIG. 12 illustrates the second embodiment where a combination of a reflection grating 612a, 612b and a focusing mirror 611a, 611b is included before each of the two detectors 603, 604 for spatially separating the wavelengths of the +1st and −1st diffraction orders on the surfaces of the detectors. For clarity of the drawing, the different wavelength components 606a, 606b are shown as single lines but it is to be understood that due to the focusing of the illumination radiation onto the target, the diffracted radiation will also consist of an effective cone for each wavelength component present in the illumination radiation. Further, only two wavelength components are shown but for a typical EUV source providing the illumination radiation many wavelength components will typically be present. The diffracting element may alternatively be a transmission diffraction grating, as opposed to the reflection grating illustrated in FIG. 12. The focusing element may be either a grazing incidence toroidal mirror or a grazing incidence cylindrical mirror. The focusing element may alternatively be an elliptical mirror, or any other free-form mirror that causes a re-focusing of the radiation. The focusing may also be achieved by a combination of multiple discrete focusing elements, e.g. a pair of mirrors. The mirror may be placed either before or after the diffracting element with respect to the direction of propagation of the radiation. In FIG. 12, the mirror is placed before the grating with respect to the direction of propagation of the radiation In the first and second embodiments, one or both of the detectors 603, 604 may also be arranged to detect the 0th order of the re-imaged radiation, 610a and 610b. Detection of the 0th order of the re-imaged radiation may yield additional information on the properties of the structure or the stack 605 between the gratings 602a and 602b forming part of the structure. However, detection of the 0th order is optional and not essential to the working of the invention. In the second embodiment illustrated in FIG. 12, the zeroth order of the re-imaged radiation has not been shown, but as in the first embodiment illustrated in FIG. 11 the zeroth order may also be detected calibration purposes, for example.

It will be appreciated that in the second embodiment the focusing element may be placed before or after the grating, both when the grating is a reflection grating and a transmission grating.

The maximum line density of the diffraction grating forming either part of the imaging grating of the first embodiment or the separate diffraction gratins of the second embodiment is set by the requirement that there exist a real angle at which diffraction orders can leave the grating surface. By real angle it is meant the opposite of an imaginary angle, in which case the light will couple as an evanescent wave and not propagate away from the grating. There will exist such a real angle if the distance between adjacent lines of the diffraction grating is at least the wavelength of the diffracted radiation. For example, the wavelength range 10-20 nm may be well suited to a grating with a line density of maximally 50 000 lines/mm.

The lower limit on the grating line density is set by the desired spectral resolution, i.e. by the minimum difference $d\lambda$ between adjacent wavelengths $\lambda$ which should be resolved. The minimum number of lines N on the grating which need to be illuminated by the beam of illumination radiation diffracted from the structure is given by $N>d\lambda/\lambda$. Realistically, for metrology of integrated circuits a resolution of about $d\lambda=0.1$ nm may be required, which for a wavelength $\lambda$ in a range close to 10 nm (i.e. a typical EUV wavelength) requires minimally N~100 lines to be illuminated. The typical divergence of the beam of diffracted radiation coming from the structure is expected to be in the region of a few mrad. Further, the re-imaging grating will typically be placed a few tens of centimeters away from the structure. As such, the spot size of the diffracted illumination radiation on the grating will be approximately 1 mm. Since this spot has to cover at least 100 lines as shown above, the line density may be at least 100 lines/mm. However, it should be understood that this is an exemplary minimum line density based on typical requirements for the spectral resolution and beam spot size. The line density may be in the range from 100 lines/mm to 50 000 lines/mm. The line density may be in the range from 1000 lines/mm to 20 000 lines/mm. The line density may be in the range from 5000 lines/mm to 10 000 lines/mm.

Figure 13:
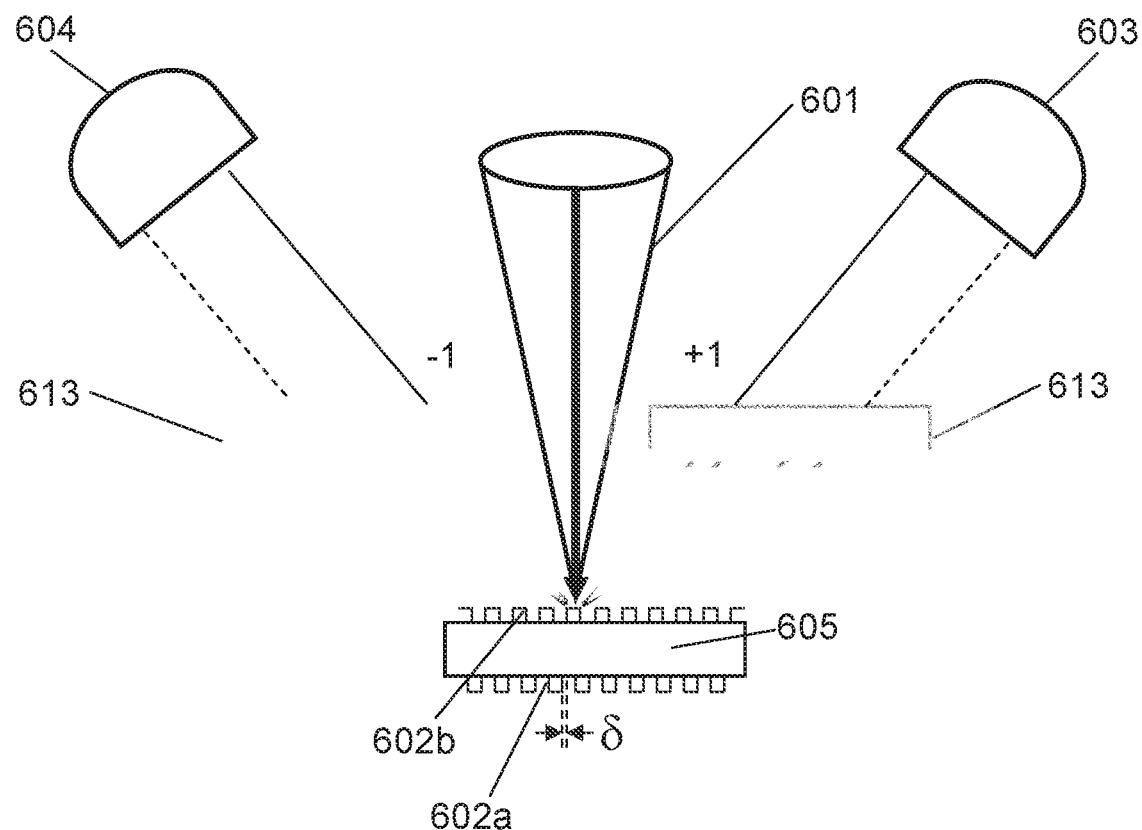
FIG. 13 illustrates a third embodiment of the invention using a mask.
Figure 14:
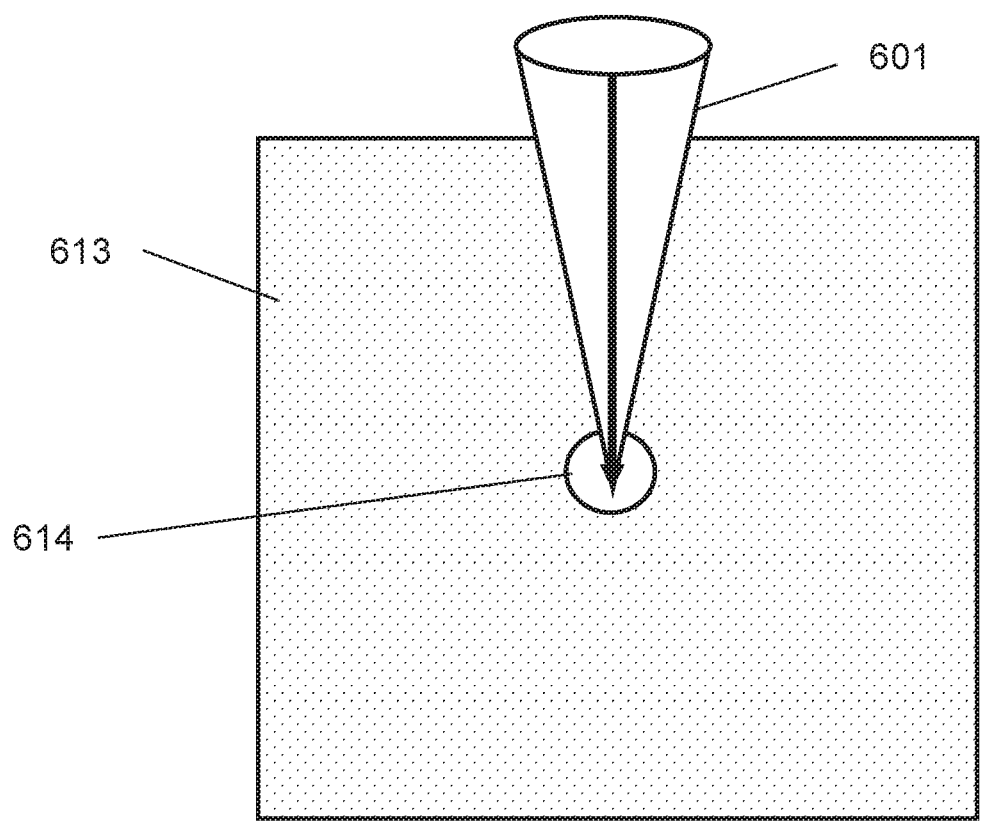
FIGS. 14 to 16 illustrate aspects of a mask used in the third embodiment of the invention.

A third embodiment of the invention will now be described with reference to FIG. 13. In this embodiment, instead of the imaging grating described above, a mask 613 is introduced between the substrate and the detectors 603, 604, in the path of the +1st and −1st diffracted orders of the illumination radiation. The mask consists of an array of apertures, wherein each aperture contains a transmission grating. The mask is similar to a Hartmann mask, which are usually optimized for full wave front reconstruction. FIG. 13 is a cross section through the centre of the mask 613. FIG. 14 is a schematic top-down view showing an opening 614 in the centre of the mask for allowing the illumination radiation 601 to propagate through the mask to the structure on the substrate below. The illumination radiation which is diffracted from the structure will impinge on the mask and be manipulated by the array of apertures and gratings formed in the mask as described below.

Figure 15:
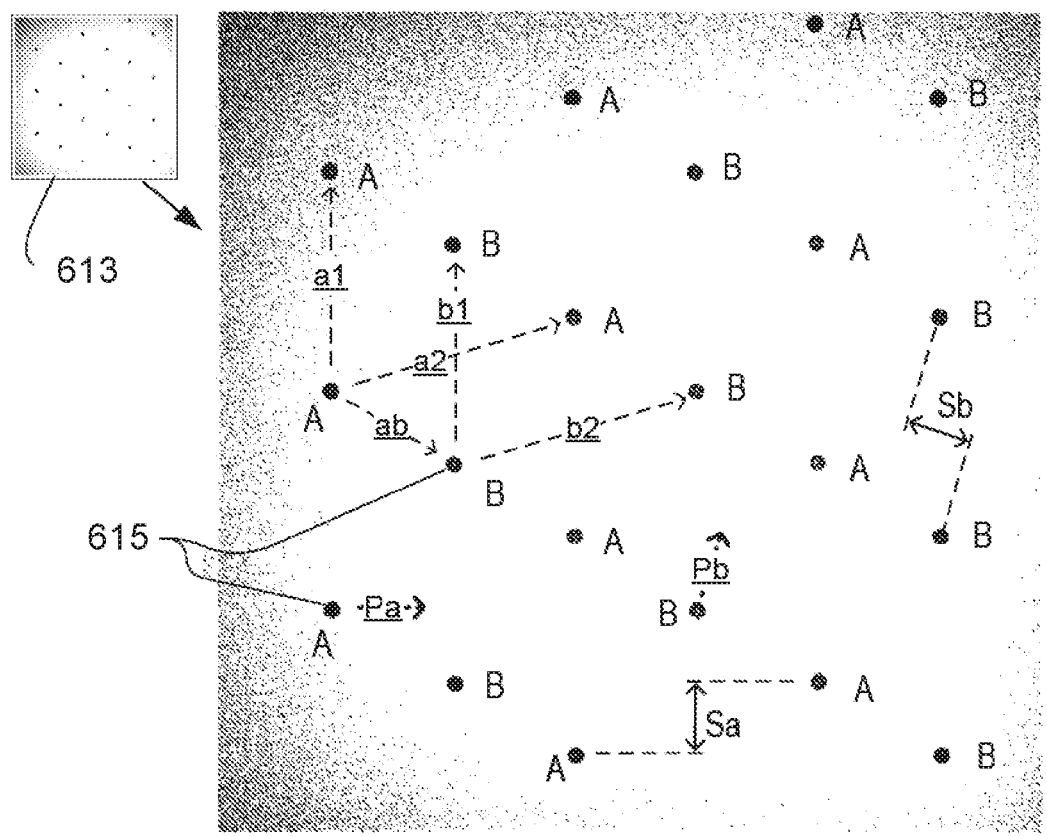

FIG. 15 is a micrograph of an example of an array of apertures with dispersive elements for use in a mask 613 according to the third embodiment. The aperture array is defined by an opaque material with apertures 615, and each aperture 615 contains a transmission grating structure. The structure in this example consists of a set of 20 µm diameter apertures milled into a metal-coated membrane (which is opaque to EUV radiation). A mask design can be optimized for a specific metrology target (which is an example of a structure of interest on substrate). For example, the aperture positions, sizes and gratings can all be optimized for best performance, e.g. optimal separation of the different wavelength components at the detectors. The aperture array in this example is defined by two interleaved subsets of aperture locations, labeled A and B. The number of subsets can be one, two, or more than two if desired. Alternatively, there may only be one set of apertures and no subset. Each subset of apertures is arrayed on a two-dimensional grid defined by two-dimensional spacing vectors a1, a2 and b1, b2 respectively. An interleaving spacing vector ab defines the offset between the two grids. It will be noted that the spacing vectors for each grid are not parallel, nor are they orthogonal. Other arrangements are permissible, without departing from the principles of the present disclosure.

Figure 16A:
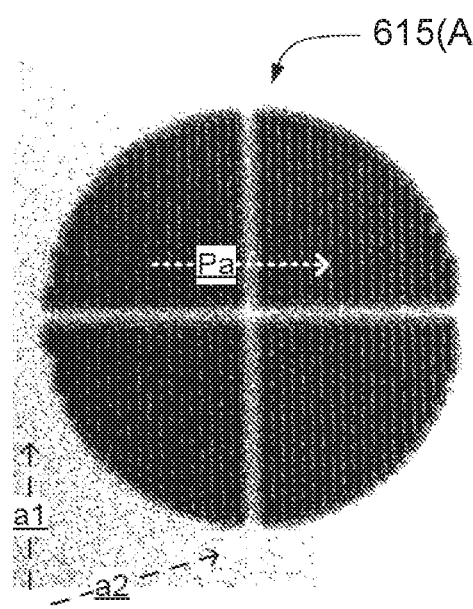
Figure 16B:
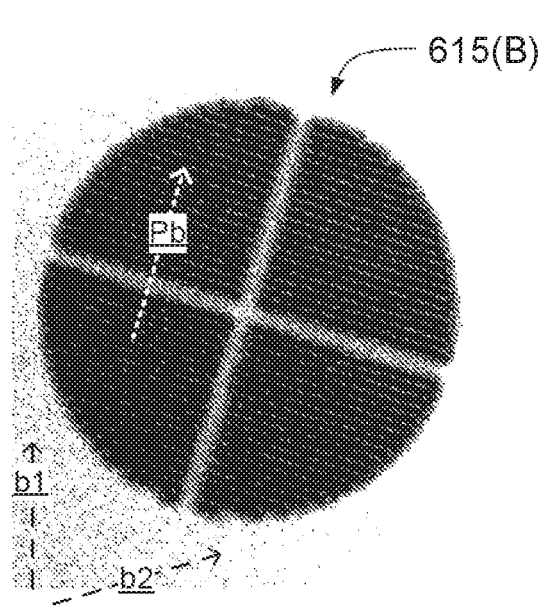

FIG. 16($a$) shows in more detail the grating structure in an aperture 615(A) belonging to subset A of the array locations, while FIG. 16($b$) shows an aperture 615(B) in the subset B. As can be seen, each grating structure fills its aperture with a grating of (transmissive) lines and (opaque) spaces. Each grating structure has a direction of periodicity, and the difference between the subsets A and B is that the direction of periodicity for the subset A, indicated by grating vector Pa, is different to the direction of periodicity for subset B, indicated by grating vector Pb. The pitch of the grating structures is such that a reasonable number of grating lines fall within the size of the aperture 615. In the example shown in the drawings, the pitch of the grating structure is 0.5 µm. The pitch is the same for both subsets, but could in principle be different.

The grating vectors Pa and Pb are shown also in FIGS. 15 and 16. It will be seen that each grating vector is at a substantially perpendicular angle to the spacing vectors of the corresponding subset of locations in the aperture array 613. The skilled reader will know that a grating structure acts to disperse radiation of different wavelengths (different spectral components) in different directions. The directions of the different spectral components are spaced along the dispersion direction. The grating vector defines also the direction of dispersion. Also marked in FIG. 15 are spacings Sa and Sb. These show the minimum separation of the locations in that subset of the array of locations, measured in a direction transverse to the dispersion direction defined by the grating vectors in that subset. In the context of the current invention it is not necessary to have apertures belonging to group A and apertures belonging to group B. All apertures may also have a similar or equal grating.

The grating structures are an example of a dispersive element. In principle, refractive dispersive elements such as prisms could also be envisaged, although gratings are more appropriate for use with extreme ultraviolet radiation. The aperture array and dispersive elements can be provided as reflective elements, instead of the transmissive elements shown. In an embodiment based on the Hartmann mask, dispersive elements will be large enough to cover the area of the focusing element. They can be formed as part of the focusing elements, if desired, or applied as a separate component. They can be arranged in different subsets if desired.

The mask 613 will spatially separate different wavelength components of the +1st and −1st diffraction orders of the illumination radiation at the surfaces of the detectors, as well as preserving the zeroth order for the purposes mentioned above in connection with the first and second embodiments. The full function of the mask is described in European Patent application EP17173786.9 filed at May 31, 2017 and a scientific article accessible at http://arxiv.org/abs/1712.04234, the contents of both of which are incorporated herein by reference in their entirety. Parameters of the mask may be chosen to optimize the amount of information which can be detected in the higher-order branches of the mask. For example, the positions, size, pitch and shape of the apertures may be optimized as well as the pitch and orientation of the grating. For metrology of semiconductor wafers, typically prior knowledge of the structure on the substrate is available. It is then possible to optimize a mask design for a specific target: e.g. design the apertures to be located at the position light is expected, chose the grating pitch to optimize the spectral resolution, etc.

Figure 17:
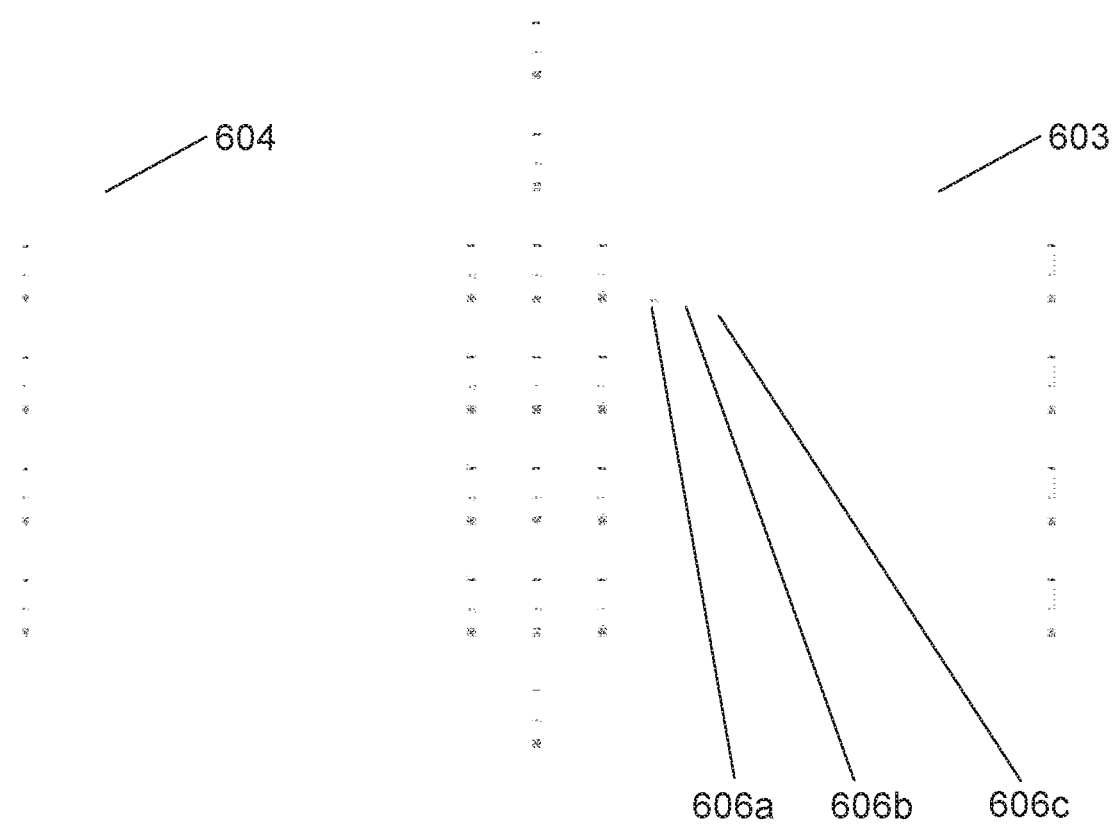
FIGS. 17 to 20 illustrate the function of the mask in separating different wavelengths at the detector surface.

The operation of the mask 613 in embodiments of the invention is illustrated with reference to FIGS. 17 to 20 of the drawings. FIG. 17 illustrates an exemplary distribution of the illumination radiation which has been diffracted from the structure of interest for the case where the illumination radiation has a very small numerical aperture and no separation optics are placed between the structure and the detectors. The different (discrete) wavelengths of the illumination radiation (e.g. HHG radiation with a spectrum as shown in of FIG. 5), are captured at the detector surfaces as small, discrete spots on both detectors 603 and 604 detecting the +1st and −1st diffraction orders respectively. The dashed vertical line is representative of a symmetry axis. For clarity only three separate wavelengths 606a, 606b and 606c are illustrated in FIGS. 17 to 20. By an intensity wavelength-by-wavelength comparison of these spots, the curves can be derived (e.g. curve as shown in FIG. 8). In the case where the illumination radiation has a very small numerical aperture, as shown in FIG. 17, the intensity for a single wavelength can be found by directly summing the intensities of the detector pixels illuminated by that wavelength. No detector pixel is illuminated by more than one of the discrete wavelength of the illumination radiation which makes analysis of the detector outputs relatively straight forward for this case where the illumination radiation has a very small or completely negligible numerical aperture and no separation optics are required. In the case of 1D conic diffraction, all spots will appear along an arc at the detector surfaces.

Figure 18:
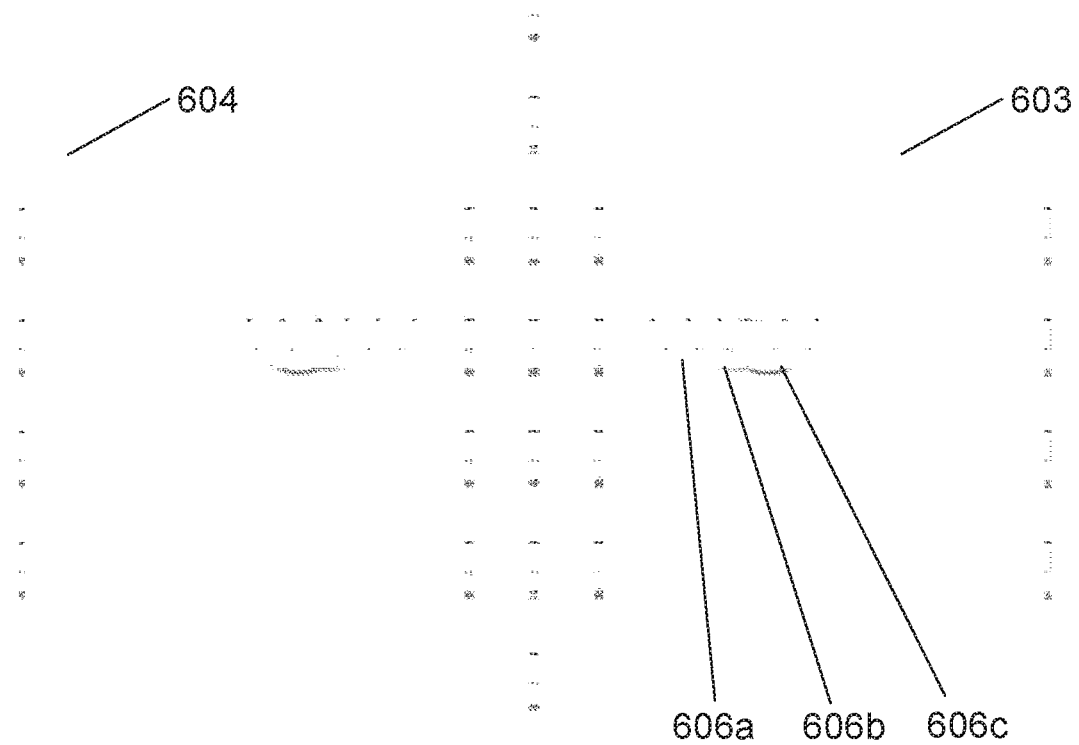

FIG. 18 illustrates an exemplary distribution of the illumination radiation which has diffracted from the structure of interest for the case where the illumination radiation has a larger numerical aperture than that of FIG. 17 and no separation optics are placed between the structure and the detectors. Such a situation may arise with a numerical aperture in the range 0.01 to 0.05. With an increased NA for the incoming beam, the different (discrete) wavelengths of the illumination radiation overlap on both detectors 603 and 604. Because of this overlap, grouping pixels to derive intensities as described above with reference to FIG. 17 cannot be used to accurately determine the total detected intensity of a single wavelength, due to the overlap.

Figure 19:
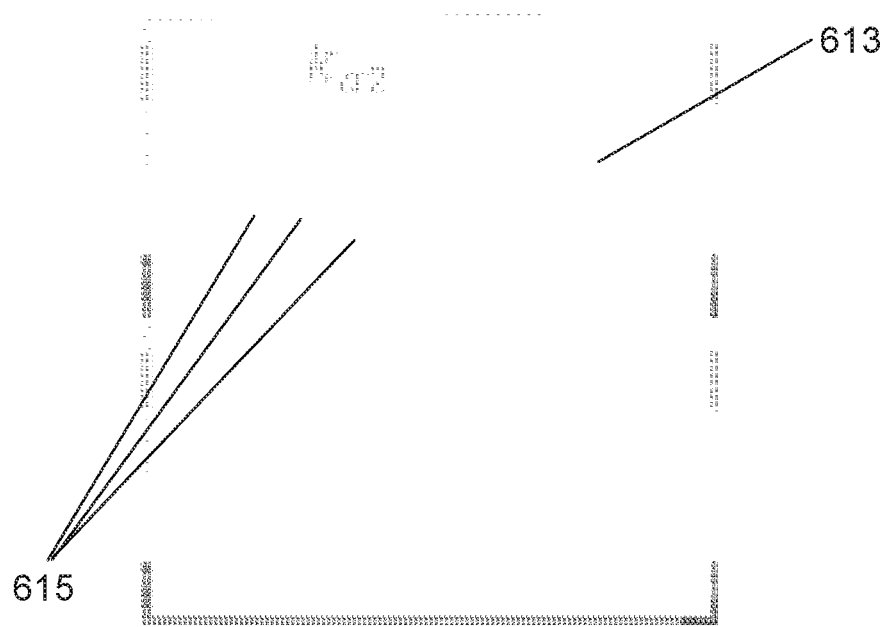

FIG. 19 illustrates a portion of an exemplary mark 613 with preferable aperture 615 positions optimized for the distribution of illumination radiation as shown in FIG. 18. $k_{g1}$, $k_{g2}$ and $k_{g3}$ indicate the direction of the grating vectors associated with each of the apertures, as explained with reference to FIG. 16. In this example, the grating vectors are approximately perpendicular to the arc along which the diffracted radiation is distributed.

Figure 20:
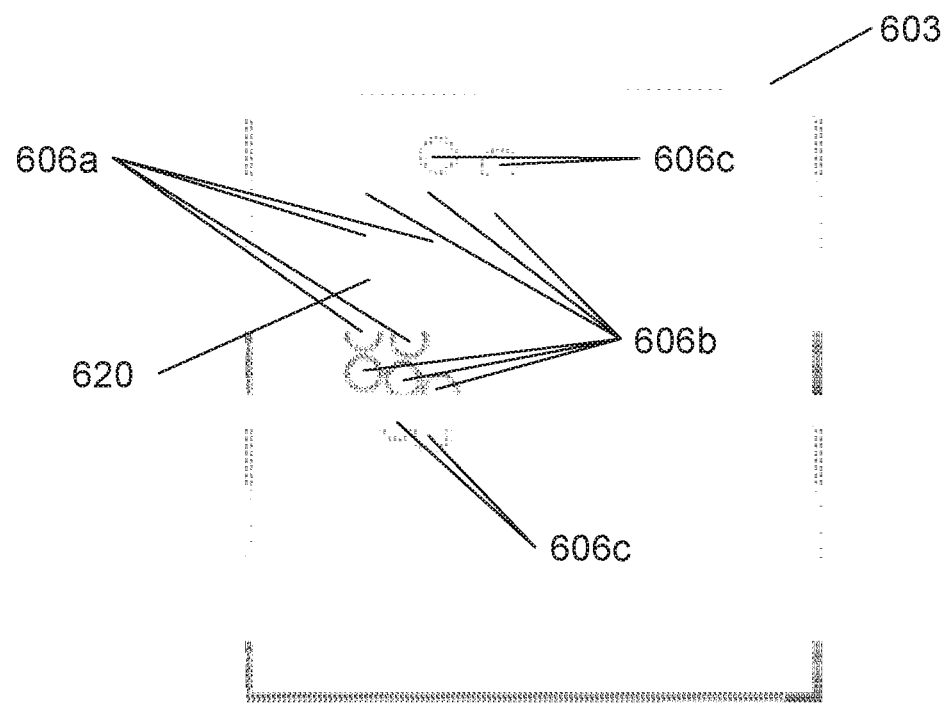

FIG. 20 illustrates the distribution of the illumination radiation which is transmitted through the mask 613 and incident on detector 603 monitoring the +1st diffraction order of the illumination radiation. In the centre, distributed along the original arc, are spots 620 corresponding to the direct transmission of the illumination radiation through the apertures of the mask. At these spots 620 the different wavelengths are still mixed. The spots above and below are where, due to the gratings in the apertures, spectrally-resolved spots are formed in the plus and minus first orders of the mask gratings. A wavelength-dependent intensity can be calculated by summing all the pixels that are illuminated by the same wavelength, and hence a curve similar to that of FIG. 8 can be derived. Accordingly the mask performs the function of spatially separating the different wavelengths of the illumination radiation diffracted from the structure of interest at the surfaces of the first and second detectors.

Figure 21:
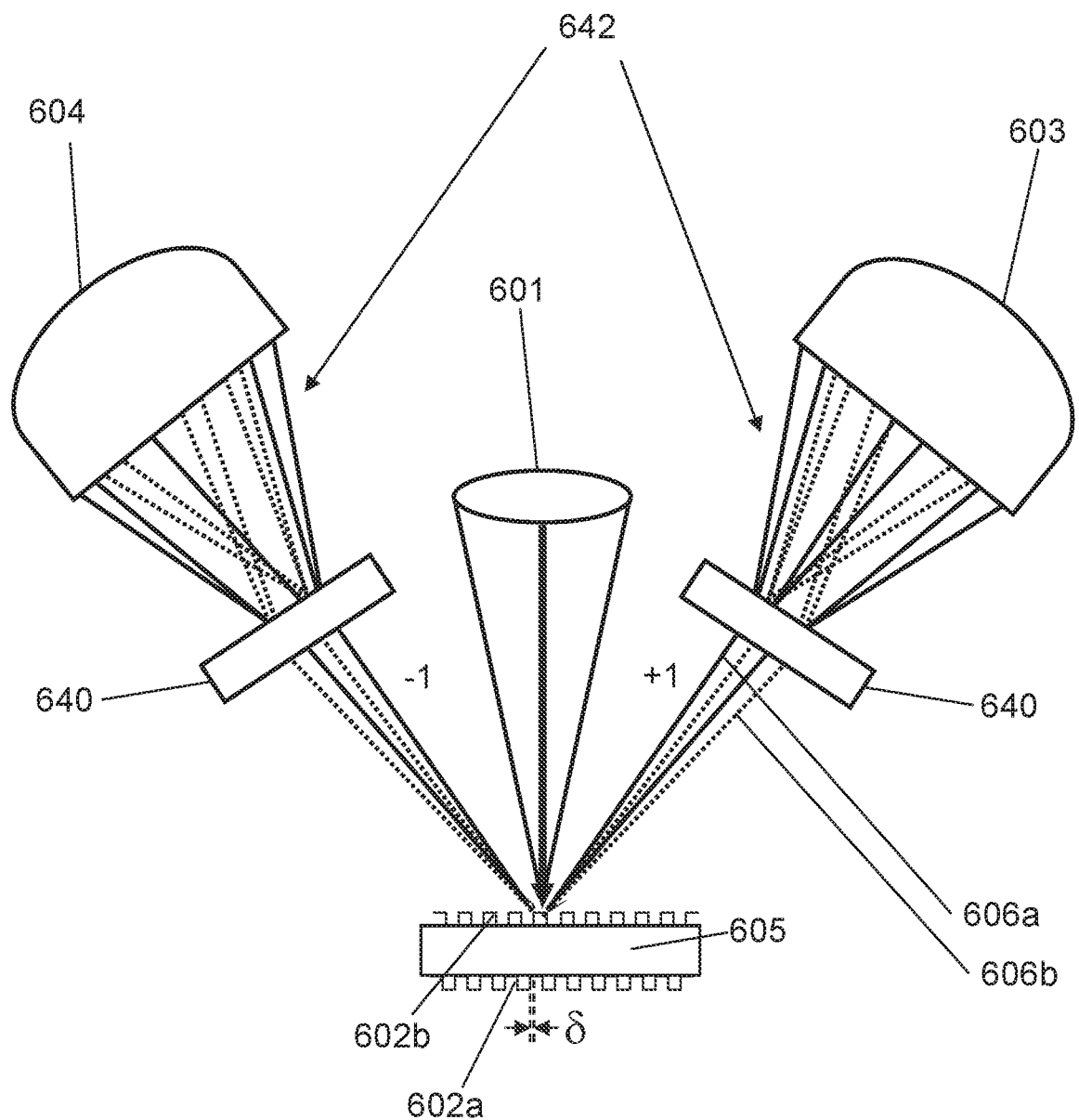
FIG. 21 illustrates a fourth embodiment of the invention using a scattering element.

A fourth embodiment of the invention will now be described with reference to FIG. 21. In this embodiment, instead of an imaging grating or a mask, additional optics in the form of a scattering element 640 are provided between the substrate and the detectors 603, 604, in the path of the +1st and −1st diffracted orders of the illumination radiation 601. The scattering element may comprise a quasi-random structurelpattern or a non-periodic structure/pattern applied to a grazing incidence mirror or a transmission film (e.g. a silicon nitride membrane). The pattern contained within,/on the scattering element may result in a polychromatic speckle pattern 642 being imparted onto the diffracted illumination radiation which is reflected from/transmitted through the scattering element. For simplicity, in FIG. 21 the illumination radiation is only shown with two discrete wavelengths 606a and 606b, although in practice the illumination radiation may comprise a larger number of different wavelengths, e.g. if the illumination radiation source is a high-harmonic generation source as described above with reference to FIG. 5.

At some regions of the resulting speckle pattern 642, different individual wavelengths of the illumination radiation may be spatially non-overlapping or less overlapping with other wavelengths than would be the case without the use of a scattering element or other separation optics. This enables more information to be extracted from the diffracted illumination radiation than would be the case without the use of the scattering element. In this sense, the resulting polychromatic speckle pattern may contain more observables than are available in the diffracted illumination radiation before the scattering element.

The non-periodic pattern on the scattering element is preferably sufficiently well-known that an analysis of the scattered illumination radiation is able to determine the intensities of different wavelength components of the illumination radiation. In this manner, the use of such a scattering element with a known non-periodic pattern is akin to a coded aperture/mask used in techniques such as X-ray imaging. The technique also draws on concepts from compressed sensing in analyzing the scattered illumination radiation.

The scattering element may be moved around spatially during data acquisition. For example, a series of exposures of the illumination radiation may be taken by the detectors 603, 604 with the scattering element in different transverse or longitudinal positions, or different rotation angles, with respect to the direction of propagation of the diffracted illumination radiation. In this manner, the technique may draw on aspects from ptychography. It is anticipated that by moving the scattering element around, additional diversity (i.e. additional wavelength dependence of the spatial distribution of illumination radiation) is introduced which may enable the extraction of more information about the diffracted illumination radiation.

In addition, the scattering element itself may be calibrated by a ptychography-like approach in combination with an appropriate choice of fiducials, e.g. special materials/thin films/multilayers to separate individual wavelengths, or gratings with specific pitches to scan the diffraction orders over the scattering element.

For the case where the scattering element comprises a non-periodic pattern applied to a grazing incidence mirror, the mirror may also have optical power, e.g. it may be a toroidal or cylindrical mirror. The use of optical power may also be extended to the case where the scattering element operates in transmission rather than reflection.

The use of a scattering element may relax certain requirements which would be placed on, for example, an imaging grating as described above with reference to the first embodiment. The imaging grating can be viewed as a special case of a scattering element where the pattern is a variable line spacing grating rather than a quasi-random or non-periodic transmission/reflection pattern.

In all of the above-described embodiments the spots on the detectors may be approximately 100 times smaller than would be the case without the separation optics. This will increase the intensity of the measured signal, even when taking into account the limited efficiency of the (curved) diffraction grating. This will improve the useful signal, compared to the shot-noise (statistical error due to the finite number of photons detected on each pixel) and hence provide a greater degree of measurement sensitivity and/or reduced acquisition time.

Figure 22:
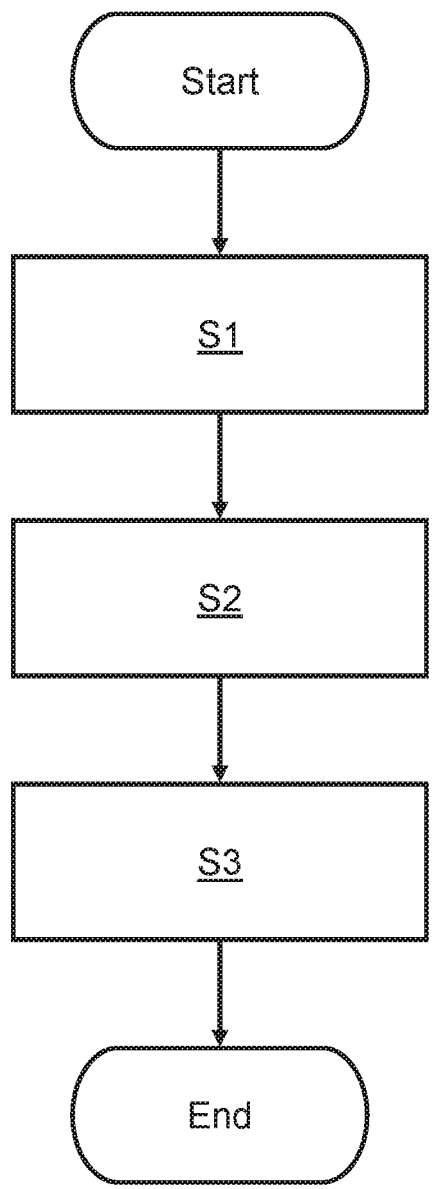
FIG. 22 is a flowchart corresponding to a method for determining a characteristic of interest of a structure on a substrate using a metrology apparatus, the structure having diffractive properties.

FIG. 22 illustrates a method for determining a characteristic of interest of a structure on a substrate using a metrology apparatus. At step S1 illumination radiation comprising a plurality of wavelengths is focused onto the structure using focusing optics (e.g. a conical mirror). At step S3 at least part of the illumination radiation which has been diffracted from the structure is detected using a first detector (e.g. in the +1st diffraction order). The first detector detects at least a non-zero diffraction order of the illumination radiation which has been diffracted from the structure. Between steps S1 and S3, at step S2 different wavelengths of the illumination radiation are spatially separated on at least a portion of the first detector using separation optics (e.g. a mask or imaging grating as described above). It will be appreciated that the step of spatially separating occurs before detection of the illumination radiation which has been diffracted from the structure of interest.

The term "wavelength-dependent spatial distribution" as ued in the context of the present invention shall be understood to mean that two or more wavelength components of the illumination radiation diffracted from the structure are given different spatial distributions on the firstlsecond detectors be means of the additional optics. In this manner, the net spatial distribution (which could be viewed as a superposition of the individual spatial distributions for each wavelength component of the illumination radiation, e.g. each harmonic produced by the HHG source) may contain regions where particular wavelength components of the illumination radiation have a higher intensity than other wavelength components and vice versa. For example, for the case where the additional optics comprise a scattering element, a series of partially-overlapping speckle patterns may be produced (one for each wavelength of the illumination radiation). Since the speckle pattern for each wavelength will in general be different, the overall spatial distribution produced by the scattering element is wavelength-dependent.

Further embodiments are disclosed in the subsequent numbered clauses:

1. A metrology apparatus for determining a characteristic of interest of a structure on a substrate, the structure having diffractive properties, the apparatus comprising:
    focusing optics configured to focus illumination radiation comprising a plurality of wavelengths onto the structure;
    a first detector configured to detect at least part of the illumination radiation which has been diffracted from the structure, and
    additional optics configured to produce, on at least a portion of the first detector, a wavelength-dependent spatial distribution of different wavelengths of the illumination radiation which has been diffracted from the structure,
    wherein the first detector is arranged to detect at least a non-zero diffraction order of the illumination radiation which has been diffracted from the structure.

2. The metrology apparatus according to clause 1, wherein the first detector is arranged to detect at least one of the +1st or −1st diffraction order of the illumination radiation which has been diffracted from the structure.

3. The metrology apparatus according to clause 1 or 2, further comprising a second detector configured to detect at least part of the illumination radiation which has been diffracted from the structure, the additional optics further configured to produce, on at least a portion of the second detector, a wavelength-dependent spatial distribution of different wavelengths of the illumination radiation which has been diffracted from the structure, wherein the first and second detectors are arranged to detect different diffraction orders.

4. The metrology apparatus according to clause 3, wherein the first and second detectors are arranged to detect the +1st and −1st diffraction orders respectively.

5. The metrology apparatus according to any preceding clause, wherein the illumination radiation comprises radiation in the extreme ultraviolet, EUV, range.

6. The metrology apparatus according to any preceding clause, further comprising a radiation source configured to emit the illumination radiation.

7. The metrology apparatus according to clause 6, wherein the radiation source is a high-harmonic generation, HHG source.

8. The metrology apparatus according to any preceding clause, wherein the additional optics comprise separation optics configured to spatially separate, on at least a portion of the first and/or second detector, different wavelengths of the illumination radiation which has been diffracted from the structure.

9. The metrology apparatus according to clause 8, wherein the separation optics are further configured to spatially combine, on at least a different portion of the first and/or second detector different wavelengths of the illumination radiation which has been diffracted from the structure.

10. The metrology apparatus according to clause 8 or 9, wherein the separation optics comprise a combination of a diffracting element and a focusing element.

11. The metrology apparatus according to clause 10, wherein the focusing element is a grazing incidence mirror.

12. The metrology apparatus according to clause 11, wherein the mirror is a cylindrical or toroidal mirror.

13. The metrology apparatus according to any one of clauses 10 to 12, wherein the diffracting element is a transmission grating.

14. The metrology apparatus according to clause 13, wherein the focusing element is placed after the transmission grating with respect to the propagation direction of the radiation.

15. The metrology apparatus according to any one of clauses 10 to 12, wherein the diffracting element is a reflection grating.

16. The metrology apparatus according to clause 15, wherein the reflection grating is placed after the focusing element with respect to the propagation direction of the radiation.

17. The metrology apparatus according to clause 10, wherein the diffracting element and the focusing element are combined as a single imaging grating.

18. The metrology apparatus according to clause 17, wherein the imaging grating comprises lines with a linear spacing.

19. The metrology apparatus according to clause 18, wherein the line density of the imaging grating is in the range from 100 lines/mm to 50 000 lines/mm.

20. The metrology apparatus according to clause 17, wherein the imaging grating comprises lines with a variable line spacing, such that the imaging grating is configured focus different wavelengths of the illumination radiation diffracted from the structure along a substantially straight line at the surface of the first and/or second detector.

21. The metrology apparatus according to any one of clauses 1 to 7, wherein the additional optics comprise a mask layer, the mask layer configured to spatially separate, on at least a portion of the first and/or second detector, different wavelengths of the illumination radiation which has been diffracted from the structure.

22. The metrology apparatus according to clause 21, wherein the mask layer comprises a substantially opaque material containing one or more apertures.

23. The metrology apparatus according to clause 22, wherein each aperture comprises a transmission grating.

24. The metrology apparatus according to clause 22 or 23, wherein the mask contains only one aperture.

25. The metrology apparatus according to any one of clauses 22 to 24, wherein the one or more apertures are rectangular.

26. The metrology apparatus according to any one of clauses 21 to 25, wherein the mask is a Hartmann-type mask.

27. The metrology apparatus according to any one of clauses 1 to 7, wherein the additional optics comprise a scattering element.

28. The metrology apparatus according to clause 27, wherein the scattering element is arranged to produce a speckle pattern in the illumination radiation which has been diffracted from the structure, wherein the first detector is arranged to detect at least a portion of the speckle pattern.

29. The metrology apparatus according to clause 27 or 28, wherein the scattering element comprises a quasi-random or non-periodic pattern.

30. The metrology apparatus according to clause 29, wherein the quasi-random or non-periodic pattern is applied to a grazing incidence mirror or a transmission film.

31. The metrology apparatus according to clause 30, wherein the quasi-random or non-periodic pattern is known by a prior characterization of the scattering element.

32. The metrology apparatus according to any one of clauses 27 to 31, wherein the scattering element is arranged to be translated or rotated.

33. The metrology apparatus according to any preceding clause, wherein the first and/or second detectors are distinct regions of a single array detector or a single line detector.

34. The metrology apparatus according to any preceding clause, further comprising a processor configured to determine a value for the characteristic of interest based on a readout from at least the first detector.

35. The metrology apparatus according to clause 34, wherein the characteristic of interest is at least one of: an overlay value (OV) of two layers within the structure; or a critical dimension (CD) value of an element within the structure.

36. The metrology apparatus according to clause 9 or any clause dependent on clause 9, wherein the metrology apparatus is configured to perform a calibration using the detected zeroth order of the illumination radiation diffracted from the structure.

37. The metrology apparatus according to any preceding clause, wherein a numerical aperture, NA, of the illumination radiation focused onto the structure is in the range 0.01 to 0.05.

38. A method for determining a characteristic of interest of a structure on a substrate using a metrology apparatus, the structure having diffractive properties, the method comprising:

focusing onto the structure illumination radiation comprising a plurality of wavelengths using focusing optics;

detecting at least part of the illumination radiation which has been diffracted from the structure using a first detector; and producing on at least a portion of the first detector, by additional optics, a wavelength-dependent spatial distribution of different wavelengths of the illumination radiation which has been diffracted from the structure, wherein the first detector detects at least a non-zero diffraction order of the illumination radiation which has been diffracted from the structure.

39. The method according to clause 38, wvherein the first detector detects at least one of the +1st or −1st diffraction order of the illumination radiation which has been diffracted from the structure.

40. The method according to clause 37 or 38, further comprising:

detecting at least part of the illumination radiation which has been diffracted from the structure using a second detector; and producing on at least a portion of the second detector, by the additional optics, a wavelength-dependent spatial distribution of different wavelengths of the illumination radiation which has been diffracted from the structure using the separation optics, wherein the first and second detectors detect different diffraction orders.

41. The method according to clause 40, wherein the first and second detectors detect the +1st and −1st diffraction orders respectively.

42. The method according to any one of clauses 38 to 41, wherein the additional optics spatially separate, on at least a portion of the first detector, different wavelengths of the illumination radiation which has been diffracted from the structure.

43. The method according to clause 42, wherein the additional optics also spatially combine, on at least a different portion of the first and/or second detectors different wavelengths of the illumination radiation which has been diffracted from the structure.

44. The method according to any one of clauses 38 to 41, wherein the additional optics comprise a scattering element for performing said step of producing a wavelength-dependent spatial distribution.

45. The method according to clause 44, wherein the scattering element produces a speckle pattern in the illumination radiation which has been diffracted from the structure, and wherein the first detector detects at least a portion of the speckle pattern.

46. The method according to clause 44 or 45, further comprising characterizing the scattering element.

47. The method according to any one of clauses 44 to 46, further comprising translating or rotating the scattering element during detection of the illumination radiation which has been diffracted from the structure.

48. The method according to any one of clauses 44 to 47, further comprising performing an analysis of the detected illumination radiation by compressed sensing.

49. The method according to any one of clauses 38 to 48, further comprising operating a radiation source to provide said illumination radiation comprising radiation in the extreme ultraviolet, EUV, range.

50. The method according to any one of clauses 38 to 49, further comprising determining a value for the characteristic of interest based on a readout from at least the first detector.

51. The method according to clause 50, wherein the characteristic of interest is at least one of: the overlay (OV) of two layers within the structure; or the critical dimension (CD) of an element within the structure.

52. A computer program comprising instructions which, when executed on at least one processor, cause the at least one processor to control an apparatus to carry out a method according to any one of clauses 38 to 52.

53. A carrier containing the computer program according to clause 52, wherein the carrier is one of an electronic signal, optical signal, radio signal, or non-transitory computer readable storage medium.

54. A lithographic apparatus comprising the metrology apparatus according to any one of clauses 1 to 37.

55. A lithographic cell comprising the apparatus according to clause 54.

Although specific reference is made in this text to "metrology apparatus", this term may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A metrology apparatus for determining a characteristic of interest of a structure on a substrate, the structure having diffractive properties, the metrology apparatus comprising:
 a radiation source configured to output illumination radiation comprising wavelengths between 1-50 nm;
 focusing optics configured to focus the illumination radiation comprising a plurality of the wavelengths onto the structure;
 a first detector configured to detect at least part of the illumination radiation which has been diffracted from the structure; and
 additional optics configured to produce, on at least a portion of the first detector, a wavelength-dependent spatial distribution of different wavelengths of the illumination radiation which has been diffracted from the structure, wherein the additional optics comprise separation optics configured to spatially separate, on at least a portion of the first detector, different wavelengths of the illumination radiation which have been diffracted from the structure,
 wherein the first detector is arranged to detect at least a non-zero diffraction order of the illumination radiation which has been diffracted from the structure.

2. The metrology apparatus of claim 1, wherein the first detector is arranged to detect at least one of the +1st or −1st diffraction order of the illumination radiation which has been diffracted from the structure.

3. The metrology apparatus of claim 1, further comprising a second detector configured to detect at least part of the illumination radiation which has been diffracted from the structure, wherein the additional optics are further configured to produce, on at least a portion of the second detector, a wavelength-dependent spatial distribution of different wavelengths of the illumination radiation which have been diffracted from the structure, wherein the first and second detectors are arranged to detect different diffraction orders.

4. The metrology apparatus of claim 3, wherein the first and second detectors are arranged to detect the +1st and −1st diffraction orders respectively.

5. The metrology apparatus of claim 1, wherein the illumination radiation comprises radiation in the extreme ultraviolet, EUV, range.

6. The metrology apparatus of claim 3, wherein the separation optics are further configured to spatially combine, on at least a different portion of at least one of the first and second detector, different wavelengths of the illumination radiation which have been diffracted from the structure.

7. The metrology apparatus of claim 1, wherein the separation optics comprise a combination of a diffracting element and a focusing element.

8. The metrology apparatus of claim 7, wherein the focusing element is a grazing incidence mirror having a cylindrical or a toroidal shape.

9. The metrology apparatus of claim 3, wherein the additional optics comprise a mask layer, the mask layer configured to spatially separate, on at least a portion of at least one of the first and second detectors, different wavelengths of the illumination radiation which has been diffracted from the structure.

10. The metrology apparatus of claim 1, wherein the additional optics comprise a scattering element.

11. The metrology apparatus of claim 10, wherein the scattering element is arranged to produce a speckle pattern in the illumination radiation which has been diffracted from the structure, wherein the first detector is arranged to detect at least a portion of the speckle pattern.

12. The metrology apparatus of claim 10, wherein the scattering element comprises a quasi-random or non-periodic pattern.

13. A method for determining a characteristic of interest of a structure on a substrate using a metrology apparatus, the structure having diffractive properties, the method comprising:
  generating illumination radiation comprising wavelengths between 1-50 nm;
  focusing onto the structure the illumination radiation comprising a plurality of the wavelengths using focusing optics;
  detecting at least part of the illumination radiation which has been diffracted from the structure using a first detector;
  spatially separating different wavelengths of the illumination radiation that have been diffracted from the structure by additional optics; and
  detecting the spatially separated different wavelengths on at least a portion of the first detector,
  wherein the first detector detects at least a non-zero diffraction order of the illumination radiation which has been diffracted from the structure.

14. A non-transitory computer-readable medium comprising instructions which, when executed on at least one processor, cause the at least one processor to control an apparatus to carry out a method of claim 13.

15. A metrology apparatus for determining a characteristic of interest of a structure on a substrate, the structure having diffractive properties, the metrology apparatus comprising:
  a radiation source configured to output illumination radiation comprising wavelengths between 1-50 nm;
  focusing optics configured to focus the illumination radiation comprising a plurality of the wavelengths onto the structure;
  a first detector configured to detect at least part of the illumination radiation which has been diffracted from the structure; and
  additional optics configured to produce, on at least a portion of the first detector, a wavelength-dependent spatial distribution of different wavelengths of the illumination radiation which has been diffracted from the structure,
  wherein the first detector is arranged to detect at least a non-zero diffraction order of the illumination radiation which has been diffracted from the structure,
  wherein at least part of a beam path of the illumination radiation passes through a vacuum environment within the metrology apparatus.

16. The method of claim 13, further comprising passing at least part of a beam path of the illumination radiation through a vacuum environment within the metrology apparatus.

* * * * *